(12) United States Patent
Luo et al.

(10) Patent No.: US 12,506,082 B2
(45) Date of Patent: Dec. 23, 2025

(54) MICROELECTRONIC DEVICES INCLUDING STAIR STEP STRUCTURES, AND RELATED MEMORY DEVICES, ELECTRONIC SYSTEMS, AND METHODS

(71) Applicant: Micron Technology, Inc., Boise, ID (US)

(72) Inventors: Shuangqiang Luo, Boise, ID (US); Indra V. Chary, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1141 days.

(21) Appl. No.: 17/304,219

(22) Filed: Jun. 16, 2021

(65) Prior Publication Data

US 2022/0406719 A1 Dec. 22, 2022

(51) Int. Cl.
*H01L 23/535* (2006.01)
*H01L 21/768* (2006.01)
*H01L 23/00* (2006.01)
*H01L 23/528* (2006.01)
*H10B 41/27* (2023.01)
*H10B 43/27* (2023.01)

(52) U.S. Cl.
CPC ...... *H01L 23/535* (2013.01); *H01L 21/76805* (2013.01); *H01L 21/76895* (2013.01); *H01L 23/5283* (2013.01); *H01L 23/562* (2013.01); *H10B 41/27* (2023.02); *H10B 43/27* (2023.02)

(58) Field of Classification Search
CPC ............ H01L 23/535; H01L 21/76805; H01L 21/76895; H01L 23/5283; H01L 23/562; H10B 41/27; H10B 43/27; H10B 41/10; H10B 43/10
See application file for complete search history.

(56) References Cited

U.S. PATENT DOCUMENTS

| | | | |
|---|---|---|---|
| 9,064,576 B2 | 6/2015 | Tanzawa | |
| 9,941,209 B2 | 4/2018 | Tessariol et al. | |
| 10,141,330 B1 | 11/2018 | Lindsay et al. | |
| 10,269,626 B2 | 4/2019 | Ha et al. | |
| 10,381,080 B2 | 8/2019 | Pan et al. | |
| 10,580,795 B1 | 3/2020 | Luo et al. | |
| 2015/0179662 A1* | 6/2015 | Makala | H10B 41/27 257/314 |
| 2015/0372101 A1* | 12/2015 | Lee | H10B 41/10 257/314 |

(Continued)

*Primary Examiner* — Ratisha Mehta
(74) *Attorney, Agent, or Firm* — TraskBritt

(57) ABSTRACT

A microelectronic device comprises a stack structure comprising a vertically alternating sequence of conductive structures and insulative structures arranged in tiers, a stair step structure within the stack structure and having steps comprising lateral edges of the tiers, pillar structures extending through the stack structure and the stair step structure and in contact with a source tier vertically underlying the stack structure, and conductive contact structures in contact with the steps of the staircase structure, the conductive contact structures individually comprising a first portion and a second portion vertically overlying the first portion, the second portion vertically above the pillar structures and having a greater lateral dimension than the first portion. Related microelectronic devices, memory devices, and electronic systems are also described.

31 Claims, 14 Drawing Sheets

(56) References Cited

U.S. PATENT DOCUMENTS

| | | | |
|---|---|---|---|
| 2016/0111437 A1* | 4/2016 | Pang | H10D 30/63 |
| | | | 257/324 |
| 2019/0198065 A1* | 6/2019 | Russo | G11C 16/08 |
| 2020/0251479 A1* | 8/2020 | Sakakibara | H01L 21/76895 |
| 2021/0358936 A1* | 11/2021 | Takuma | H10B 43/27 |
| 2022/0399359 A1* | 12/2022 | Kim | H10B 43/27 |

* cited by examiner

MICROELECTRONIC DEVICES INCLUDING STAIR STEP STRUCTURES, AND RELATED MEMORY DEVICES, ELECTRONIC SYSTEMS, AND METHODS

TECHNICAL FIELD

The disclosure, in various embodiments, relates generally to the field of microelectronic device design and fabrication. More specifically, the disclosure relates to microelectronic devices, and related memory devices, electronic systems, and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming so-called at least one "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. As the height of the stacks increases to facilitate additional memory cells in the vertical memory arrays, the stack may be prone to toppling or collapse during various processing acts. For example, during replacement gate processing acts, the stack may be subject to tier collapse during or after removal of portions of the tiers to be replaced with conductive structures. Collapse of the portions of the stack may reduce reliability of the vertical memory strings. In addition, as the density of vertical memory strings increases, the margin between conductive contact structures and other structures (e.g., support pillar structures) of the vertical memory array decreases, increasing the difficulty of forming the vertical memory array.

BRIEF DESCRIPTION OF THE DRAWINGS

FIG. 1A through FIG. 1K are simplified cross-sectional views (FIG. 1A through FIG. 1E, FIG. 1G through FIG. 1I, and FIG. 1K), and (FIG. 1F, FIG. 1H, and FIG. 1J) illustrating a method of forming a microelectronic device, in accordance with embodiments of the disclosure;

DETAILED DESCRIPTION

Figure 1A:
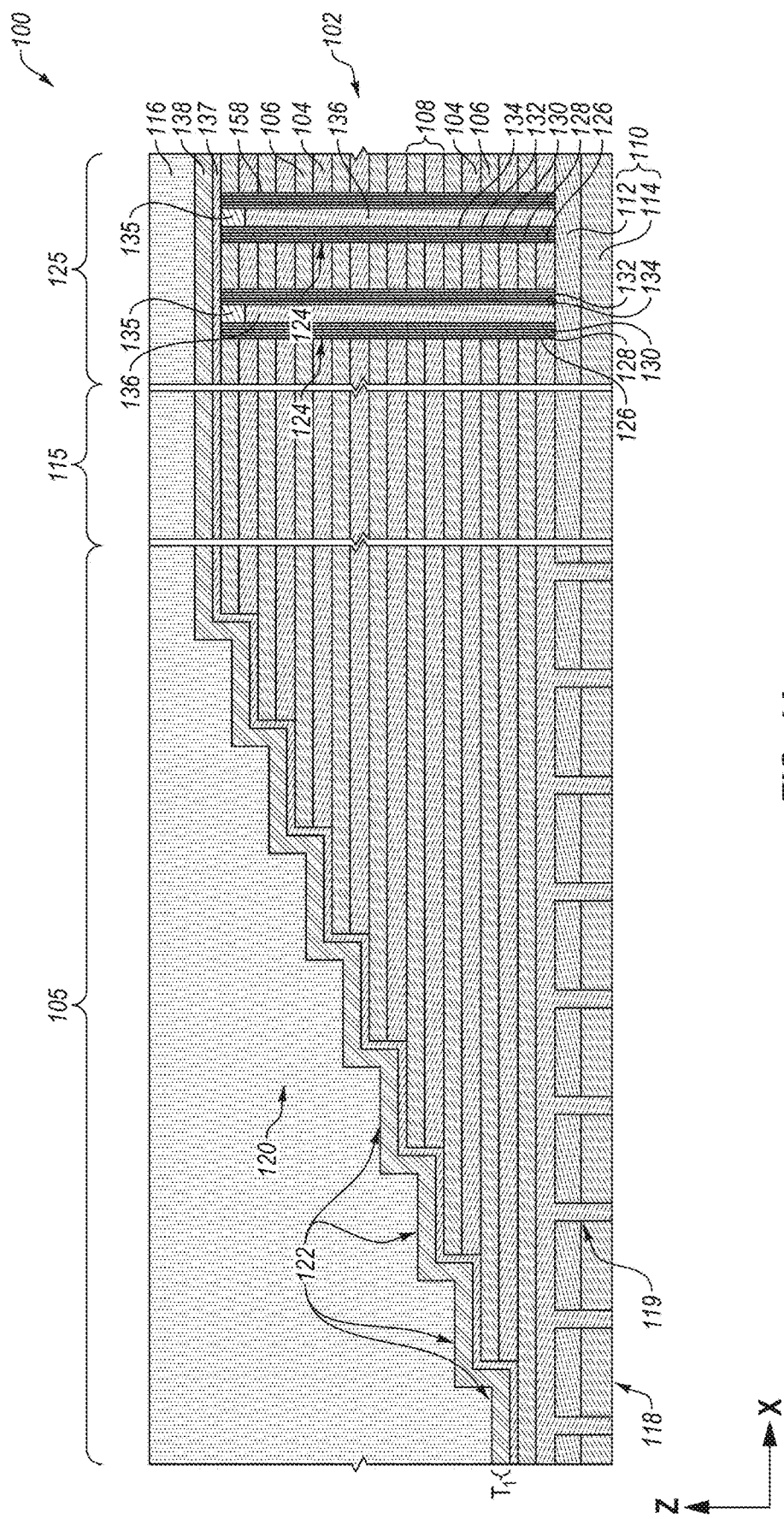

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device structure or microelectronic device (e.g., a memory device, such as a 3D NAND Flash memory device) or a complete microelectronic device. The structures described below do not form a complete microelectronic device. Only those process acts and structures necessary to understand the embodiments described herein are described in detail below. Additional acts to form a complete microelectronic device from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random-access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device structure includes a stack structure comprising a vertically alternating sequence of insulative structures and conductive structures arranged in tiers. The stack structure may include strings of memory cells vertically extending through the stack structure and a stair case region including one or more stair step structures. Each of the stair step structures may include steps defined at lateral edges of the tiers of the vertically alternating sequence of insulative structures and conductive structures. Pillar structures (e.g., conductive pillar structures, support pillar structures) vertically extend through a dielectric material vertically overlying the stair step structures and the stack structure. Conductive contact structures vertically extend through the dielectric material and are in electrical communication with steps of the stair step structure. The conductive contact structures may each include a first portion in electrical communication with one of the conductive structures of the stair step structure and a second portion in electrical communication with the first portion. A vertical height of the first portion may be about the same as a vertical height of the pillar structures. The second portion may vertically extend above the first portion and the pillar structures. In some embodiments, the second portion has a greater lateral dimension (e.g., diameter) than a lateral dimension (e.g., diameter) of the first portion. In some embodiments, an insulative liner material is between the conductive material of the conductive contact structures and the dielectric material vertically overlying the stair step structure. A nitride material may laterally neighbor the first portion of the conductive contact structures and vertically intervene between the dielectric material and the conductive structure that the respective conductive contact structure is in electrical communication with.

The microelectronic device may be formed by forming a first insulative liner material over a stack structure comprising a vertically alternating sequence of insulative structures and additional insulative structures arranged in tiers; and forming a second insulative liner material over the first insulative liner material. The stack structure includes a stair step structure comprising steps defined at lateral edges of the tiers of the insulative structures and the additional insulative structures. First openings are formed through a dielectric material vertically overlying the stair step structure to expose portions of the second insulative liner material. A sacrificial material is formed in the first openings to form sacrificial structures. Second openings are formed through the dielectric material and the stack structure to expose portions of a source tier vertically underlying the stack structure. The second openings laterally neighbor the sacrificial structures. The second openings are filled with a liner material and a first material to form pillar structures. Slots are formed through the dielectric material and the stack structure and the additional insulative structures are removed and replaced with conductive structures through so-called "replacement gate" or "gate last" processing acts to form an additional stack structure comprising a vertically alternating sequence of the insulative structures and the conductive structures arranged in tiers. After forming the conductive structures, a mask material is formed over the microelectronic device structure and openings are formed in the mask material to expose the sacrificial structures. The openings have a greater lateral dimension than a lateral dimension of the first openings and the corresponding sacrificial structures. The sacrificial material of the sacrificial structures is removed (e.g., exhumed) through the openings in the mask material to form third openings (corresponding to the size, shape, and location of the first openings) and expose the portions of second insulative liner material. The exposed portions of the second insulative liner material are removed through the third openings to expose vertically underlying portions of the conductive structures. A conductive material is formed in the third openings and in electrical communication with the conductive structures to form conductive contact structures. The conductive contact structures each individually comprise a first portion having a lateral dimension corresponding to the lateral dimension of the first openings and a second portion vertically overlying the first portion and having a lateral dimension corresponding to the lateral dimension of the openings in the mask material.

Forming the first openings from which the conductive contact structures are formed prior to forming the pillar structures facilitates forming the microelectronic device structure to exhibit a smaller dimension and a greater density of memory cells compared to conventional microelectronic device structures. For example, forming the first openings prior to the pillar structures facilitates forming the conductive contact structures proximate the pillar structures without so-called pillar fall off wherein the conductive contact structures do not form suitable electrical connections to the conductive structures. By way of contrast, conductive contact structures of microelectronic device structures formed according to conventional methods may be formed through a stack structure and stop on an etch stop material. However, portions of the etch stop material may undesirably be removed during formation of pillar structures prior to formation of the conductive contact structures. Forming the first openings and the sacrificial structures prior to forming the pillar structures facilitates forming the conductive contact structures at desired locations.

FIG. 1A through FIG. 1K illustrate a method of forming a microelectronic device structure 100 for a microelectronic device (e.g., a memory device, such as a 3D NAND Flash memory device), in accordance with embodiments of the disclosure. With the description provided below, it will be readily apparent to one of ordinary skill in the art that the methods and structures described herein with reference to FIG. 1A through FIG. 1K may be used in the formation and configuration of various devices and electronic systems.

FIG. 1A is a simplified partial cross-sectional view of a microelectronic device structure 100. The microelectronic device structure 100 may, for example, comprise a portion of a memory device (e.g., a multi-deck 3D NAND Flash memory device, such as a dual deck 3D NAND Flash memory device). With reference to FIG. 1A, the microelectronic device structure 100 includes a stack structure 102 including a vertically alternating (e.g., in the Z-direction) sequence of insulative structures 104 (also referred to herein as "insulative levels") and additional insulative structures 106 (also referred to herein as "additional insulative levels") arranged in tiers 108. Each of the tiers 108 of the stack structure 102 may include at least one (1) of the insulative structures 104 vertically neighboring at least one (1) of the additional insulative structures 106. The insulative structures 104 and the additional insulative structures 106 may be interleaved with each other.

The insulative structures 104 may each individually be formed of and include, for example, at least one insulative material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium oxide ($HfO_2$), tantalum oxide ($TaO_2$), magnesium oxide (MgO), aluminum oxide ($Al_2O_3$), or a combination thereof), and amorphous carbon. In some embodiments, the insulative structures 104 comprise silicon dioxide. Each of the insulative structures 104 may individually include a substantially homogeneous distribution of the at least one insulating material, or a substantially heterogeneous distribution of the at least one insulating material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the insulative structures 104 of each of the tiers 108 of the stack structure 102 exhibits a substantially homogeneous distribution of insulative material. In additional embodiments, at least one of the insulative structures 104 of at least one of the tiers 108 of the stack structure 102 exhibits a substantially heterogeneous distribution of at least one insulative material. The insulative structures 104 may, for example, be formed of and include a stack (e.g., laminate) of at least two different insulative materials. The insulative structures 104 of each of the tiers 108 of the stack structure 102 may each be substantially planar, and may each individually exhibit a desired thickness.

The levels of the additional insulative structures 106 may be formed of and include at least one insulative material that is different than, and exhibits an etch selectivity with respect to, the insulative structures 104. In some embodiments, the additional insulative structures 106 are formed of and include a nitride material (e.g., silicon nitride ($Si_3N_4$)) or an oxynitride material (e.g., silicon oxynitride). In some embodiments, the additional insulative structures 106 comprise silicon nitride.

Although FIG. 1A illustrates a particular number of tiers 108 of the insulative structures 104 and the additional insulative structures 106, the disclosure is not so limited. In some embodiments, the stack structure 102 includes a desired quantity of the tiers 108, such as within a range from thirty-two (32) of the tiers 108 to two hundred fifty-six (256) of the tiers 108. In some embodiments, the stack structure 102 includes sixty-four (64) of the tiers 108. In other embodiments, the stack structure 102 includes a different number of the tiers 108, such as less than sixty-four (64) of the tiers 108 (e.g., less than or equal to sixty (60) of the tiers 108, less than or equal to fifty (50) of the tiers 108, less than about forty (40) of the tiers 108, less than or equal to thirty (30) of the tiers 108, less than or equal to twenty (20) of the tiers 108, less than or equal to ten (10) of the tiers 108); or greater than sixty-four (64) of the tiers 108 (e.g., greater than or equal to seventy (70) of the tiers 108, greater than or equal to one hundred (100) of the tiers 108, greater than or equal to about one hundred twenty-eight (128) of the tiers 108, greater than two hundred fifty-six (256) of the tiers 108) of the insulative structures 104 and the additional insulative structures 106. In addition, in some embodiments, the stack structure 102 overlies a deck structure comprising additional tiers 108 of insulative structures 104 and the additional insulative structures, separated from the stack structure 102 by at least one dielectric material, such as an interdeck insulative material.

With continued reference to FIG. 1A, the microelectronic device structure 100 further includes a source tier 110 vertically underlying (e.g., in the Z-direction) the stack structure 102. The source tier 110 may comprise, for example, a first source material 112 and a second source material 114. The first source material 112 may be formed of and include at least one conductive material, such as one or more of a metal (e.g., W, Ti, Mo, Nb, V, Hf, Ta, Cr, Zr, Fe, Ru, Os, Co, Rh, Ir, Ni, Pd, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy), a conductive metal-containing material (e.g., a conductive metal nitride, a conductive metal silicide, a conductive metal carbide, a conductive metal oxide), or a doped semiconductor material (e.g., a semiconductor material doped with one or more P-type dopants (e.g., polysilicon doped with at least one P-type dopant, such as one or more of boron, aluminum, and gallium) or one or more N-type conductivity materials (e.g., polysilicon doped with at least one N-type dopant, such as one or more of arsenic, phosphorous, antimony, and bismuth)). In some embodiments, the first source material 112 comprises conductively-doped silicon.

The second source material 114 may be formed of and include one or more of a metal silicide material (e.g., tungsten silicide ($WSi_x$)), a metal nitride material (e.g., tungsten nitride), and a metal silicon nitride material (e.g., tungsten silicon nitride ($WSi_xN_y$)). In some embodiments, the second source material 114 comprises tungsten silicide.

A dielectric material 116 may vertically (e.g., in the Z-direction) overlie a vertically uppermost tier 108 of the insulative structures 104 and the additional insulative structures 106. The dielectric material 116 may comprise one or more of the materials described above with reference to the insulative structures 104. In some embodiments, the dielectric material 116 comprises silicon dioxide.

With continued reference to FIG. 1A, the microelectronic device structure 100 may include a staircase region 105 including a stair step structure 120, a crest region 115 laterally (e.g., in the X-direction) neighboring the staircase region 105, and an array region 125 laterally (e.g., in the X-direction) neighboring the crest region 115.

In some embodiments, the source tier 110 includes discrete source structures 118 within the staircase region 105 and within the crest region 115. The discrete source structures 118 may be isolated from each other by insulative structures 119.

The staircase region 105 may include at least one stair step structure 120 including steps 122 comprising horizontal edges of the tiers 108 of the insulative structures 104 and additional insulative structures 106. The number of steps 122 of the stair step structure 120 may correspond to the number of tiers 108 of the insulative structures 104 and the additional insulative structures 106.

The array region 125 may include pillars 124 vertically extending (e.g., in the Z-direction) through the stack structure 102 and in contact with the source tier 110. As will be described herein, materials of the pillars 124 may be employed to form memory cells (e.g., strings of NAND memory cells). The pillars 124 may each individually comprise a barrier material 126 horizontally neighboring the levels of the insulative structures 104 and the additional insulative structures 106 of one of the tiers 108 of the stack structure 102; a charge blocking material (also referred to as a "dielectric blocking material") 128 horizontally neighboring the barrier material 126; a memory material 130 horizontally neighboring the charge blocking material 128; a tunnel dielectric material (also referred to as a "tunneling dielectric material") 132 horizontally neighboring the memory material 130; a channel material 134 horizontally neighboring the tunnel dielectric material 132; and an insulative material 136 in a center portion of the pillars 124. The channel material 134 may be horizontally interposed between the insulative material 136 and the tunnel dielectric material 132; the tunnel dielectric material 132 may be horizontally interposed between the channel material 134 and the memory material 130; the memory material 130 may be horizontally interposed between the tunnel dielectric material 132 and the charge blocking material 128; the charge blocking material 128 may be horizontally interposed between the memory material 130 and the barrier material 126; and the barrier material 126 may be horizontally interposed between the charge blocking material 128 and the levels of the insulative structures 104 and additional insulative structures 106.

In some embodiments, the pillars 124 do not include the barrier material 126 and the charge blocking material 128 horizontally neighbors the levels of the insulative structures 104 and additional insulative structures 106.

The barrier material 126 may be formed of and include one or more of at least one metal oxide (e.g., one or more of aluminum oxide, hafnium oxide, zirconium oxide, lanthanum oxide, yttrium oxide, tantalum oxide, gadolinium oxide, niobium oxide, titanium oxide), at least one dielectric silicide (e.g., aluminum silicide, hafnium silicate, zirconium silicate, lanthanum silicide, yttrium silicide, tantalum silicide), and at least one dielectric nitride (e.g., aluminum nitride, hafnium nitride, lanthanum nitride, yttrium nitride, tantalum nitride). In some embodiments, the barrier material 126 comprises aluminum oxide.

The charge blocking material 128 may be formed of and include at least one dielectric material such as, for example, one or more of an oxide (e.g., silicon dioxide), a nitride (silicon nitride), and an oxynitride (silicon oxynitride), or another material. In some embodiments, the charge blocking material 128 comprises silicon oxynitride.

The memory material 130 may formed of and include at least one charge trapping material or at least one conductive material. The memory material 130 may be formed of and include one or more of silicon nitride, silicon oxynitride, polysilicon (doped polysilicon), a conductive material (tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 130 comprises silicon nitride.

The tunnel dielectric material 132 may be formed of and include at least one dielectric material through which charge tunneling can be performed under suitable electrical bias conditions, such as through hot-carrier injection or by Fowler-Nordheim tunneling induced charge transfer. By way of non-limiting example, the tunnel dielectric material 132 may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In some embodiments, the tunnel dielectric material 132 comprises silicon dioxide. In other embodiments, the tunnel dielectric material 132 comprises nitrogen, such as an oxynitride. In some such embodiments, the tunnel dielectric material 132 comprises silicon oxynitride.

In some embodiments the tunnel dielectric material 132, the memory material 130, and the charge blocking material 128 together may comprise a structure configured to trap a charge, such as, for example, an oxide-nitride-oxide (ONO) structure. In some such embodiments, the tunnel dielectric material 132 comprises silicon dioxide, the memory material 130 comprises silicon nitride, and the charge blocking material 128 comprises silicon dioxide. In other embodiments, the tunnel dielectric material 132, the memory material 130, and the charge blocking material 128 together comprise an oxide-nitride-oxynitride structure. In some such embodiments, the tunnel dielectric material 132 comprises silicon oxynitride, the memory material 130 comprises silicon nitride, and the charge blocking material 128 comprises silicon dioxide.

The channel material 134 may be formed of and include one or more of at least one semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and at least one oxide semiconductor material. In some embodiments, the channel material 134 includes one or more of amorphous silicon and polycrystalline silicon ("polysilicon"). In some embodiments, the channel material 134 comprises a doped semiconductor material.

In some embodiments the channel material 134, the tunnel dielectric material 132, the memory material 130, and the charge blocking material 128 are collectively referred to herein as "memory cell materials."

The insulative material 136 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 136 comprises silicon dioxide.

In some embodiments, the pillars 124 may include conductive material 135 in electrical communication with the channel material 134 of the pillars 124. The conductive material 135 may be formed of and include, for example, tungsten. In other embodiments, the conductive material 135 is formed of and include polysilicon.

With continued reference to FIG. 1A, a first insulative liner material 137 may vertically (e.g., in the Z-direction) overlie the stair step structure 120, the vertically uppermost tier 108 of the insulative structures 104 and the additional insulative structures 106, and an upper surface of the pillars 124. A second insulative liner material 138 may vertically overlie the first insulative liner material 137.

The first insulative liner material 137 may be formed of and include at least one insulative material, such as one or more of the materials described above with reference to the insulative structures 104. In some embodiments, the first insulative liner material 137 comprises substantially the same material composition as the insulative structures 104. In other embodiments, the first insulative liner material 137 comprises a different material composition than the insulative structures 104. In some embodiments, the first insulative liner material 137 comprises silicon dioxide.

The second insulative liner material 138 may exhibit an etch selectivity relative to the first insulative liner material 137 and the dielectric material 116. The second insulative liner material 138 may be formed of and include one or more of the materials described above with reference to the additional insulative structures 106. In some embodiments, the second insulative liner material 138 comprises substantially the same material composition as the additional insulative structures 106. In other embodiments, the second insulative liner material 138 comprises a different material composition than the additional insulative structures 106. In some embodiments, the second insulative liner material 138 comprises silicon nitride.

The second insulative liner material 138 may have a thickness $T_1$ (e.g., height) in the vertical direction (e.g., in the Z-direction) within a range from about 50 nm to about 100 nm, such as from about 50 nanometers (nm) to about 60 nm, from about 60 nm to about 80 nm, or from about 80 nm to about 100 nm. In some embodiments, the thickness $T_1$ is about 80 nm. In some embodiments, the thickness $T_1$ of the second insulative liner material 138 may be greater than a thickness of the first insulative liner material 137. As will be described herein, the second insulative liner material 138 may act as an etch stop material during subsequent processing acts and the thickness $T_1$ of the second insulative liner material 138 may be tailored to facilitate use of the second insulative liner material 138 as an etch stop material.

The second insulative liner material 138 may be formed by one or more of CVD, ALD, plasma enhanced ALD, PVD, PECVD, or LPCVD. In some embodiments, the second insulative liner material 138 is formed at a temperature greater than about 600° C., such as greater than about 650° C. In some embodiments, the second insulative liner material 138 is formed at a temperature of about 680° C. In some embodiments, forming the second insulative liner material 138 at a temperature greater than about 600° C. (e.g., about 680° C.) may increase a density of the second insulative liner material 138 relative to the density of the first insulative liner material 137 and relative to second insulative liner materials 138 formed at lower temperatures. The increased density of the second insulative liner material 138 may increase an etch selectivity of the second insulative liner material 138 relative to the first insulative liner material 137. By way of comparison, liner materials formed at lower temperatures (e.g., about 570° C.) may exhibit a reduced etch selectivity relative to other insulative liner materials.

Figure 1B:
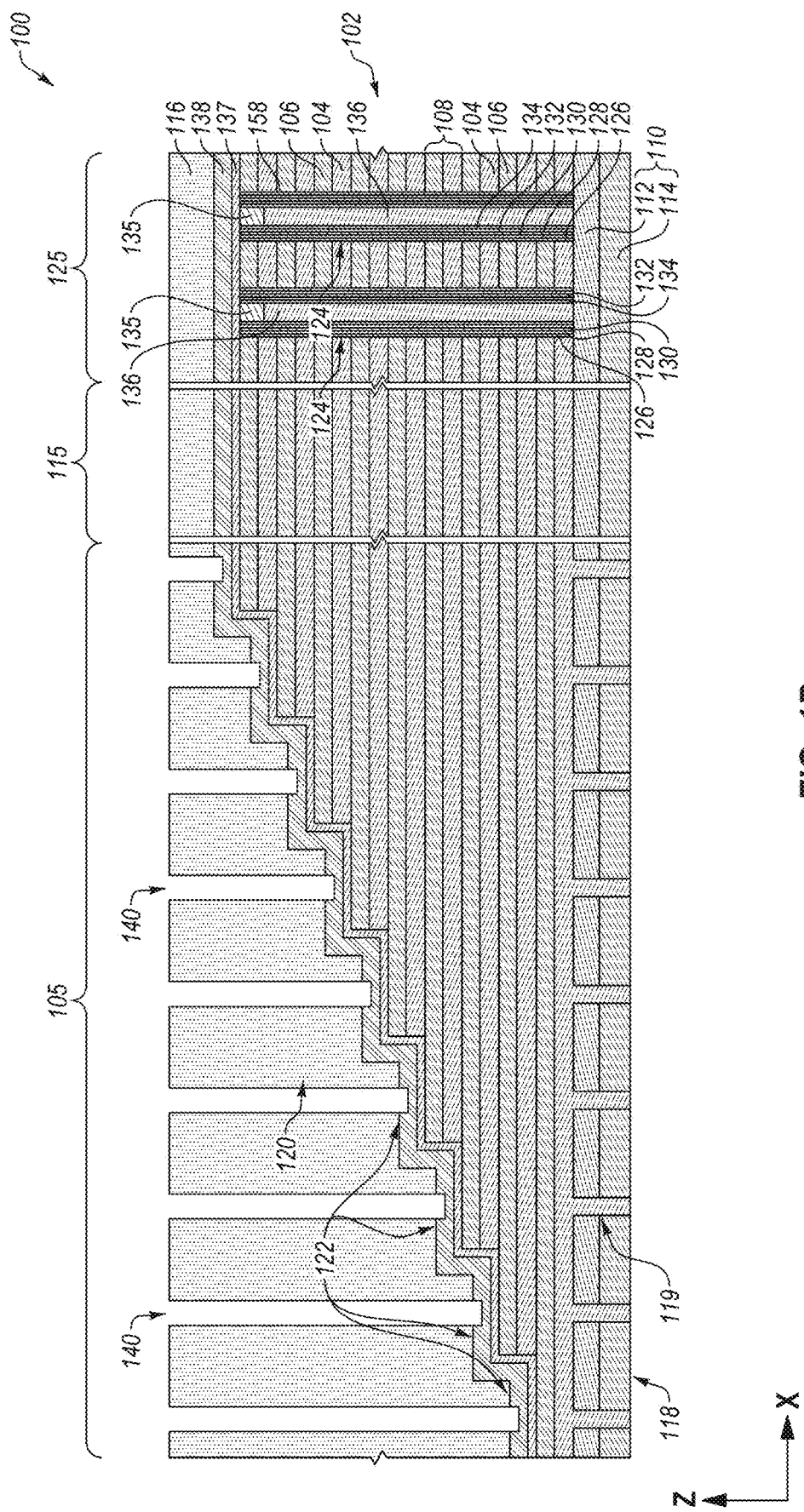

Referring now to FIG. 1B, first openings 140 may be formed through the dielectric material 116 vertically overlying the stair step structure 120. In some embodiments, the second insulative liner material 138 may act as an etch stop material during removal of the dielectric material 116 and formation of the first openings 140. In some such embodiments, the first openings 140 may terminate within the second insulative liner material 138. As will be described herein, the first openings 140 may be used to form conductive contact structures (e.g., first conductive contact structures 182 (FIG. 1K)) in contact with conductive structures (e.g., conductive structures 152 (FIG. 1K)) of a stair step structure (e.g., stair step structure 120 (FIG. 1K)).

Figure 1C:
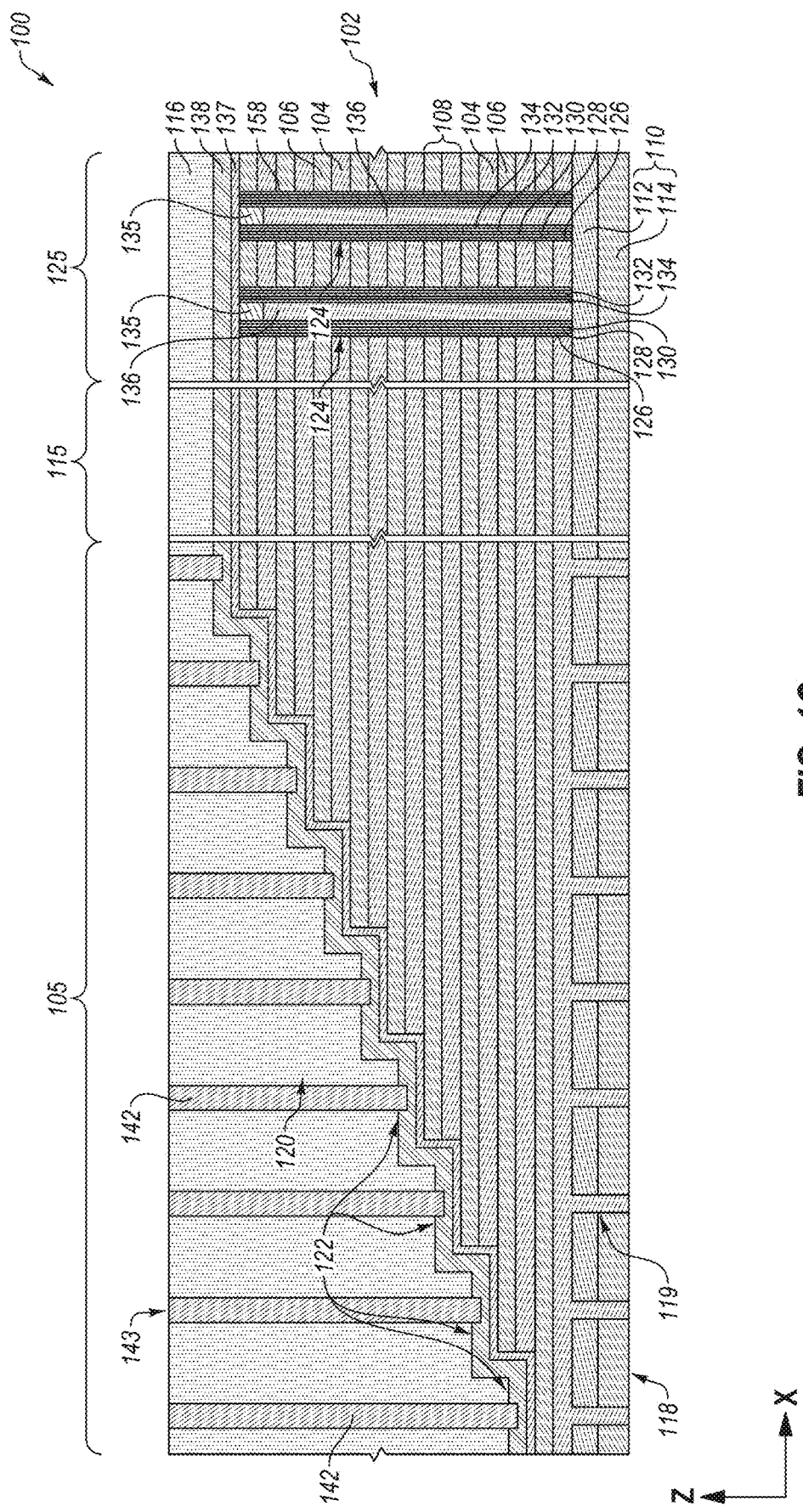

With reference to FIG. 1C, sacrificial material 142 may be formed within the first openings 140 (FIG. 1B) to form sacrificial structures 143. The sacrificial material 142 may substantially fill the first openings 140 and be in contact with the second insulative liner material 138. After forming the sacrificial material 142, the microelectronic device structure 100 may be exposed to a chemical mechanical planarization (CMP) process to remove sacrificial material outside of the first openings 140.

The sacrificial material 142 may be formed of and include at least one material exhibiting an etch selectivity with respect to the dielectric material 116 and the second insulative liner material 138. In some embodiments, the sacrificial material 142 comprises conductive material. By way of non-limiting example, the sacrificial material 142 may be formed of and include one or more of polysilicon, tungsten, titanium, titanium nitride, or another material. In some embodiments, the sacrificial material 142 comprises polysilicon. In some such embodiments, the sacrificial material 142 may be doped with one or more dopants, such as with at least one N-type dopant (e.g., one or more of arsenic, phosphorous, antimony, and bismuth) or at least one P-type dopant (e.g., one or more of boron, aluminum, and gallium). In other embodiments, the sacrificial material 142 comprises tungsten.

Figure 1D:
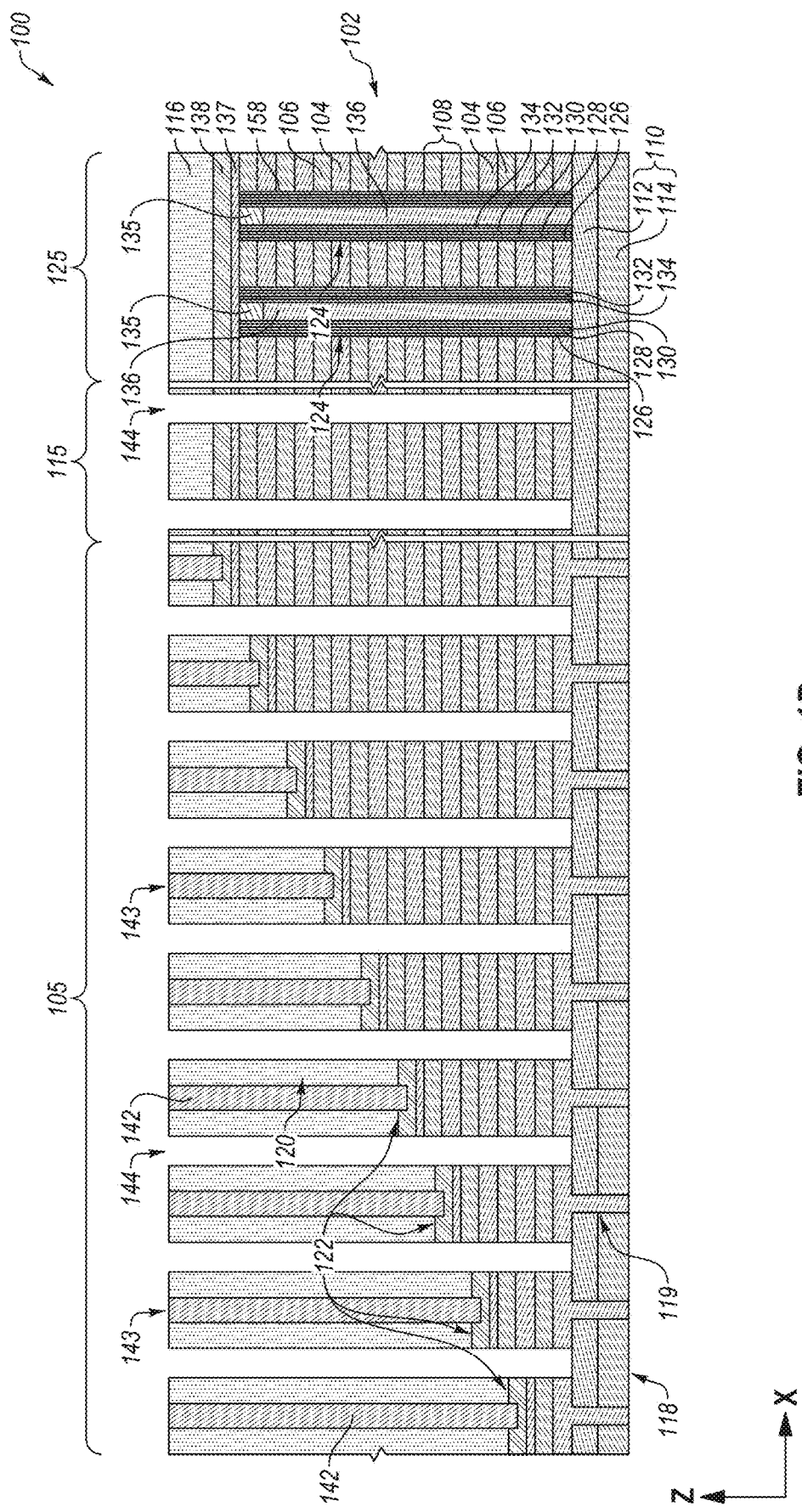

Referring to FIG. 1D, second openings 144 may be formed to vertically extend (e.g., in the Z-direction) through the dielectric material 116 and the stack structure 102, such as through the dielectric material 116 and the tiers 108 of the insulative structures 104 and the additional insulative structures 106. The second openings 144 may laterally (e.g., in the X-direction, in the Y-direction) neighbor the sacrificial structures 143. The second openings 144 may be formed in the staircase region 105 and the crest region 115. The second openings 144 may terminate within the source tier 110, such as within the first source material 112.

Figure 1E:
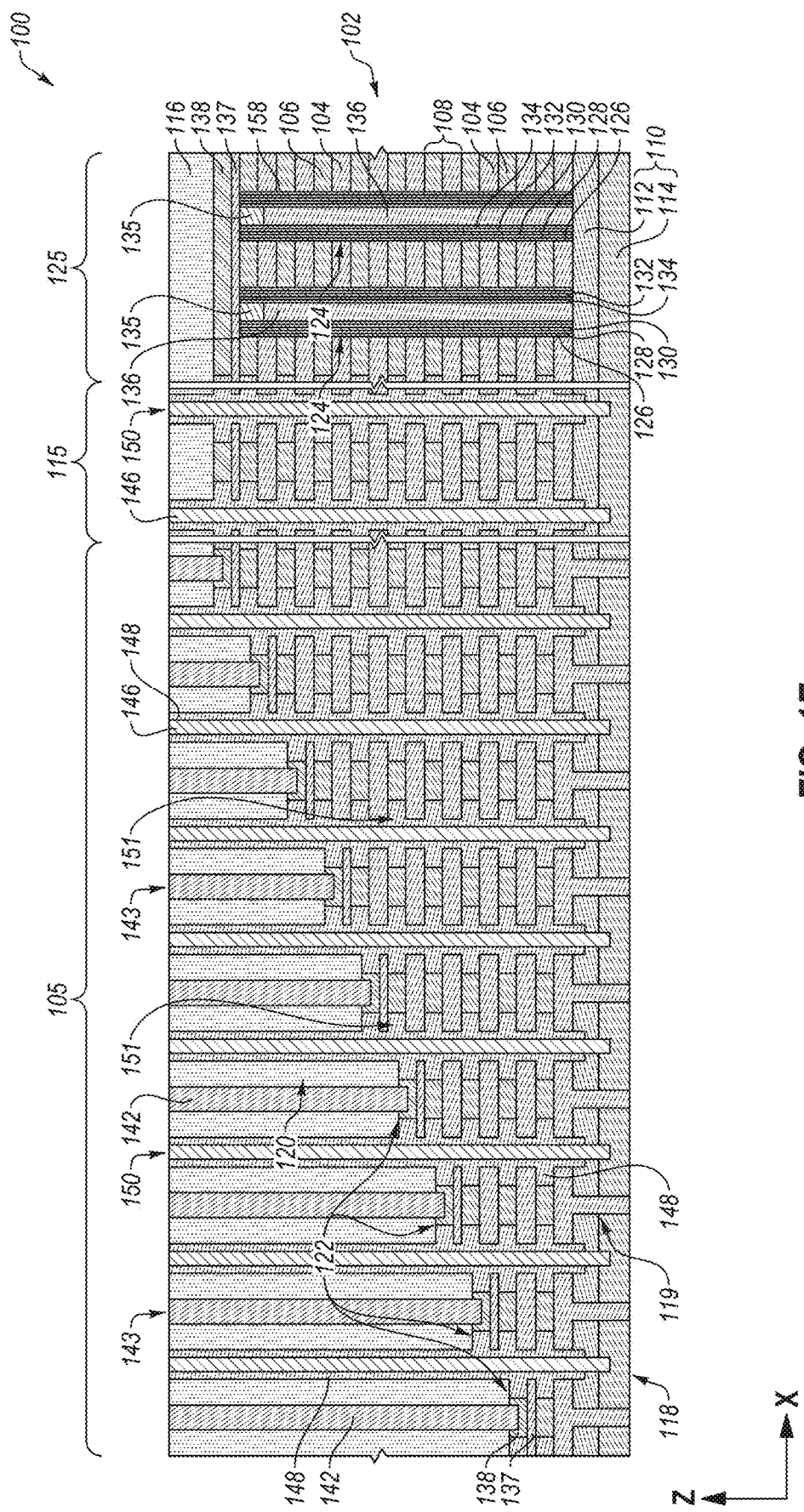

Referring now to FIG. 1E, lateral (e.g., in the X-direction, in the Y-direction) portions of the additional insulative structures 106 and the second insulative liner material 138 may be selectively removed through the second openings 144 (FIG. 1D). By way of non-limiting example, exposed portions of the additional insulative structures 106 and the second insulative liner material 138 may be exposed to an etchant (e.g., a wet etchant) through the second openings 144 to selectively remove portions of the additional insulative structures 106 and the second insulative liner material 138 with respect to the dielectric material 116, the insulative structures 104, and the first source material 112. In some embodiments, the additional insulative structures 106 and the second insulative liner material 138 are exposed to phosphoric acid ($H_3PO_4$) to selectively remove portions of the additional insulative structures 106 and the second insulative liner material 138.

After selectively removing portions of the additional insulative structures 106 and the second insulative liner material 138, pillar structures 150 may be formed within the second openings 144 (FIG. 1D). The pillar structures 150 may each individually comprise a first material 146 vertically extending through the stack structure 102 and to the source tier 110, and a liner material 148 on sidewalls of the first material 146. In some embodiments, the pillar structures 150 within the stair step structure 120 terminate (e.g., land on) the second source material 114. The liner material 148 may substantially surround (e.g., substantially horizontally and vertically cover) sidewalls of the first material 146. In some embodiments, at least some of the pillar structures 150 are in electrical communication with a structure (e.g., a CMOS structure) underlying the source tier 110.

In some embodiments, vertically (e.g., in the Z-direction) upper surfaces of the sacrificial material 142 of the sacrificial structures 143 are substantially vertically (e.g., in the Z-direction) coplanar with vertically upper surface of the pillar structures 150. Stated another way, upper surfaces of the sacrificial material 142 of the sacrificial structures 143 may have about a same height as the pillar structures 150. In other embodiments, vertically upper surfaces of the sacrificial material 142 of the sacrificial structures 143 are vertically below upper surfaces of the pillar structures 150. Stated another way, upper surfaces of the pillar structures 150 may vertically extend above upper surfaces of the sacrificial structures 143.

The first material 146 may be formed of and include at least one conductive material, such as such as one or more of at least one metal (e.g., W, Ti, Mo, Nb, V, Hf, Ta, Cr, Zr, Fe, Ru, Os, Co, Rh, Ir, Ni, Pd, Pt, Cu, Ag, Au, Al), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), at least one conductive metal-containing material (e.g., a conductive metal nitride, a conductive metal silicide, a conductive metal carbide, a conductive metal oxide), and at least one conductively-doped semiconductor material (e.g., conductively-doped Si, conductively-doped Ge, conductively-doped SiGe). In some embodiments, the first material 146 of each of the pillar structures 150 has substantially the same material composition.

In other embodiments, the first material 146 is formed of and includes at least one insulative material. In some such embodiments, the first material 146 is formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the first material 146 comprise $SiO_2$. In some embodiments, such as where the first material 146 comprises an insulative material, the microelectronic device structure 100 does not include the liner material 148 on sidewalls of the first material 146 and the pillar structures 150 may comprise only the first material 146 (e.g., the insulative material).

The pillar structures 150 may each individually exhibit a desired geometric configuration (e.g., dimensions and shape) and spacing. The geometric configurations and spacing of the pillar structures 150 may be selected at least partially based on the configurations and positions of other components (e.g., the steps 122 of the stair step structure 120, conductive contact structures to be formed in contact with the steps 122 of the stair step structure 120, the source tier 110) of the microelectronic device structure 100. For example, the pillar structures 150 may each individually have a geometric configuration and spacing permitting the pillar structure 150 to vertically-extend (e.g., in the Z-direction) through the stack structure 102 and physically contact (e.g., land on) a structure of the source tier 110 to facilitate a predetermined function (e.g., an electrical interconnection function, a support function) of the pillar structure 150. In other embodiments, the pillar structures 150 do not include an electrical interconnection function and serve primarily (e.g., only) a support function. Each of the pillar structures 150 may exhibit substantially the same geometric configuration (e.g., the same dimensions and the same shape) and horizontal spacing (e.g., in the X-direction) as each of the other pillar structures 150, or at least some of the pillar structures 150 may exhibit a different geometric configuration (e.g., one or more different dimensions, a different shape) and/or different horizontal spacing than at least some other of the pillar structures 150. In some embodiments, the pillar structures 150 are at least partially uniformly spaced in the X-direction and in the Y-direction.

The pillar structures 150 may serve as support structures during and/or after the formation of one or more components of the microelectronic device structure 100. For example, the pillar structures 150 may serve as support structures for the formation of the conductive structures (e.g., conductive structures 152 (FIG. 1G)) during replacement of the additional insulative structures 106 to form the conductive structures, as will be described herein. The pillar structures 150 may impede (e.g., prevent) tier collapse during the selective removal of the additional insulative structures 106.

The liner material 148 may be horizontally interposed between each of the first materials 146 of the pillar structures 150 and the tiers 108 (including the insulative structures 104 and the additional insulative structures 106 thereof) of the stack structure 102. In some embodiments, the liner material 148 exhibits a greater dimension in the X-direction and the Y-direction at portions 151 neighboring the additional insulative structures 106 than along other portions of the pillar structures 150. For example, the liner material 148 may exhibit a relatively larger dimension at the portions 151 corresponding to intersections of the additional insulative structures 106 and the liner material 148 of the pillar structures 150 at relative to other portions of the liner material 148.

The liner material 148 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the liner material 148 comprises $SiO_2$. In some embodiments, the liner material 148 has a different material composition than one or both of the dielectric material 116 and the insulative structures 104. In other embodiments, the liner material 148 has the same material composition as one or both of the dielectric material 116 and the insulative structures 104. In some embodiments, the liner material 148 comprises a material composition that is not substantially removed responsive to exposure to etch chemistries formulated and configured to remove silicon nitride.

Figure 1F:
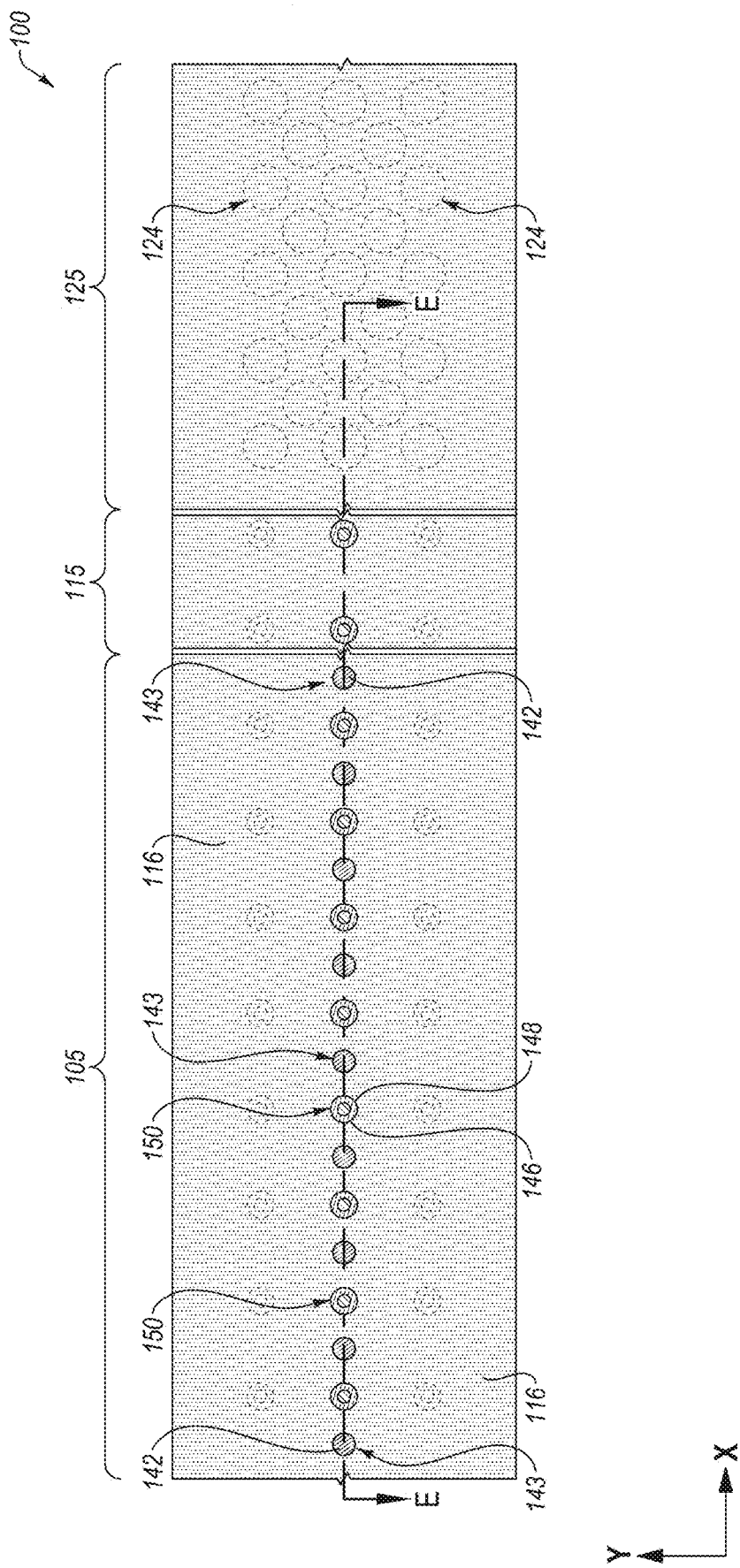

FIG. 1F is a simplified partial top-down view of the microelectronic device structure 100 of FIG. 1E. The cross-sectional view of FIG. 1E is taken through section line E-E of FIG. 1F. With reference to FIG. 1F, the pillar structures 150 may laterally (e.g., in the X-direction, in the Y-direction) neighbor one another. In some embodiments, the sacrificial structures 143 laterally (e.g., in the X-direction) intervenes between laterally neighboring pillar structures 150. With combined reference to FIG. 1E and FIG. 1F, the sacrificial structures 143 may be located on the steps 122 of the stair step structure 120. In other words, each step 122 may individually be in contact with one of the sacrificial structures 143.

In some embodiments, the pillar structures 150 are arranged in rows extending in the X-direction and in columns extending in the Y-direction between. In other embodiments, the pillar structures 150 are at least partially non-uniformly spaced in the X-direction. In some embodiments, the sacrificial structures 143 laterally (e.g., in the X-direction) neighbor some of the pillar structures 150. For example, in some embodiments, one of the rows of the pillar structures 150 includes the sacrificial structures 143 laterally interposed between laterally neighboring pillar structures 150 while other rows of the pillar structures 150 do not include the sacrificial structures 143. In some embodiments, a middle row of the pillar structures 150 includes laterally neighboring sacrificial structures 143.

With continued reference to FIG. 1F, in some embodiments, the crest region 115 includes the pillar structures 150 within horizontal boundaries thereof, and does not include the sacrificial structures 143 within the horizontal boundaries thereof. In FIG. 1F, the pillars 124 in the array region 125 are shown in broken lines to indicate they are located vertically (e.g., in the Z-direction) below the dielectric material 116.

The pillars 124 are illustrated in broken lines in FIG. 1F to indicate that they are located below the upper surface of the dielectric material 116.

Figure 1G:
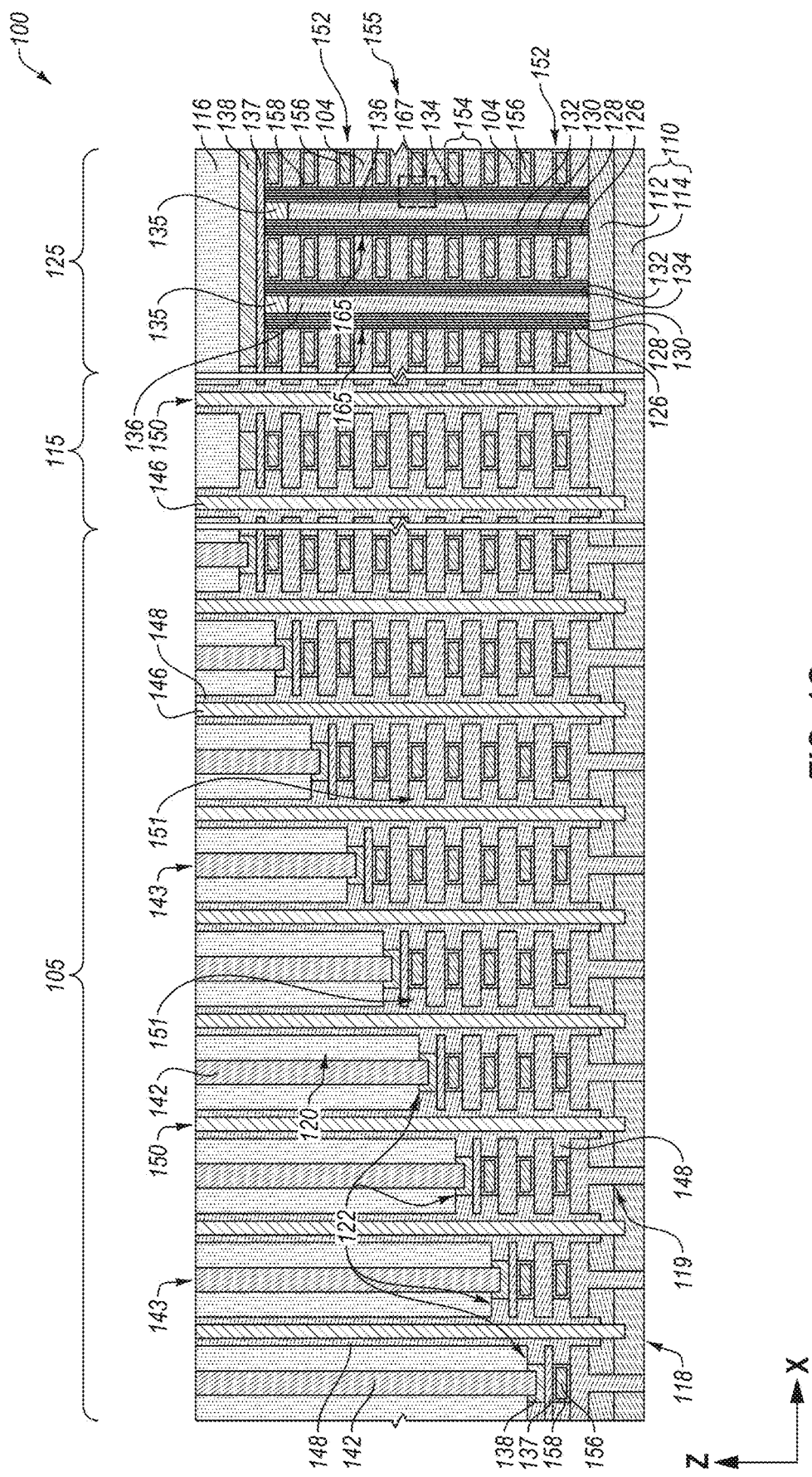
Figure 1H:
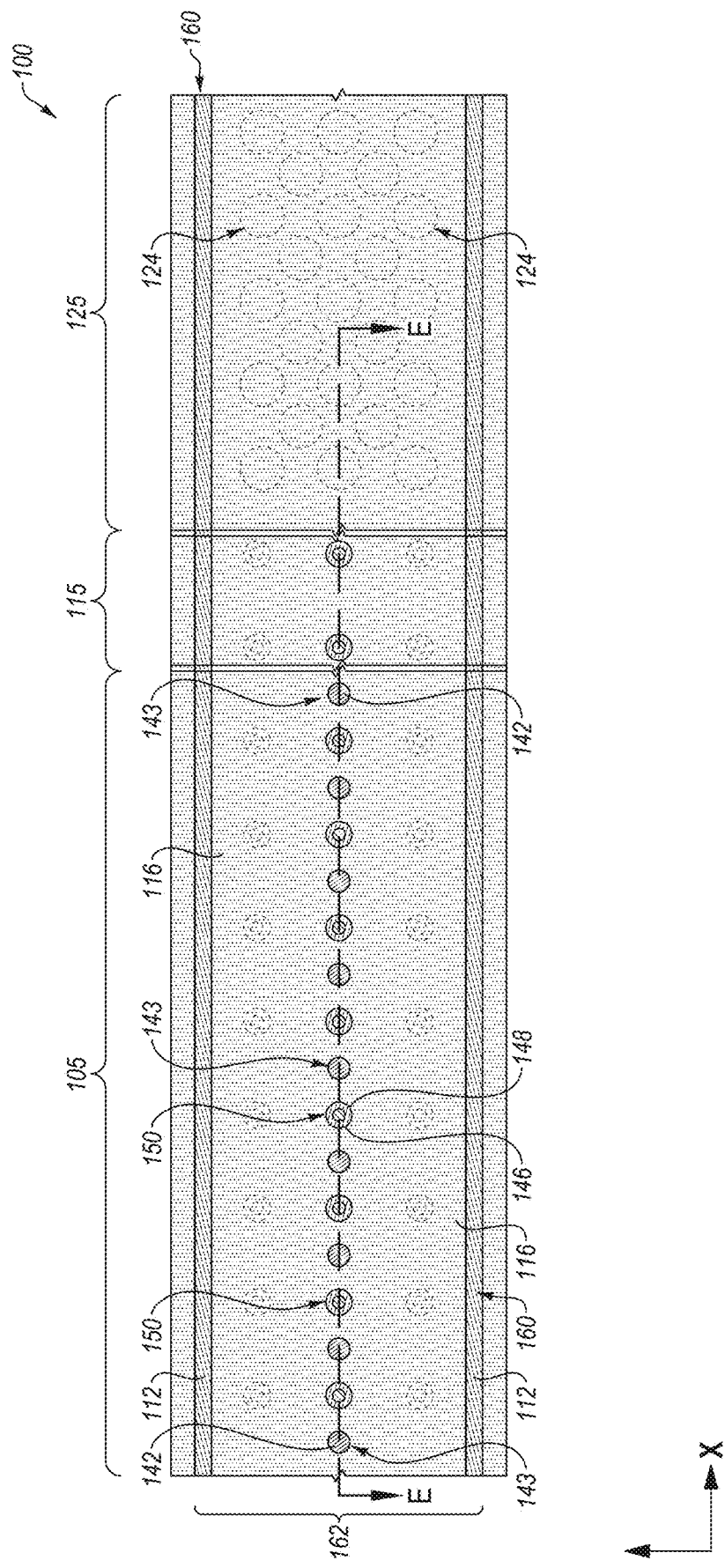
Figure 11:
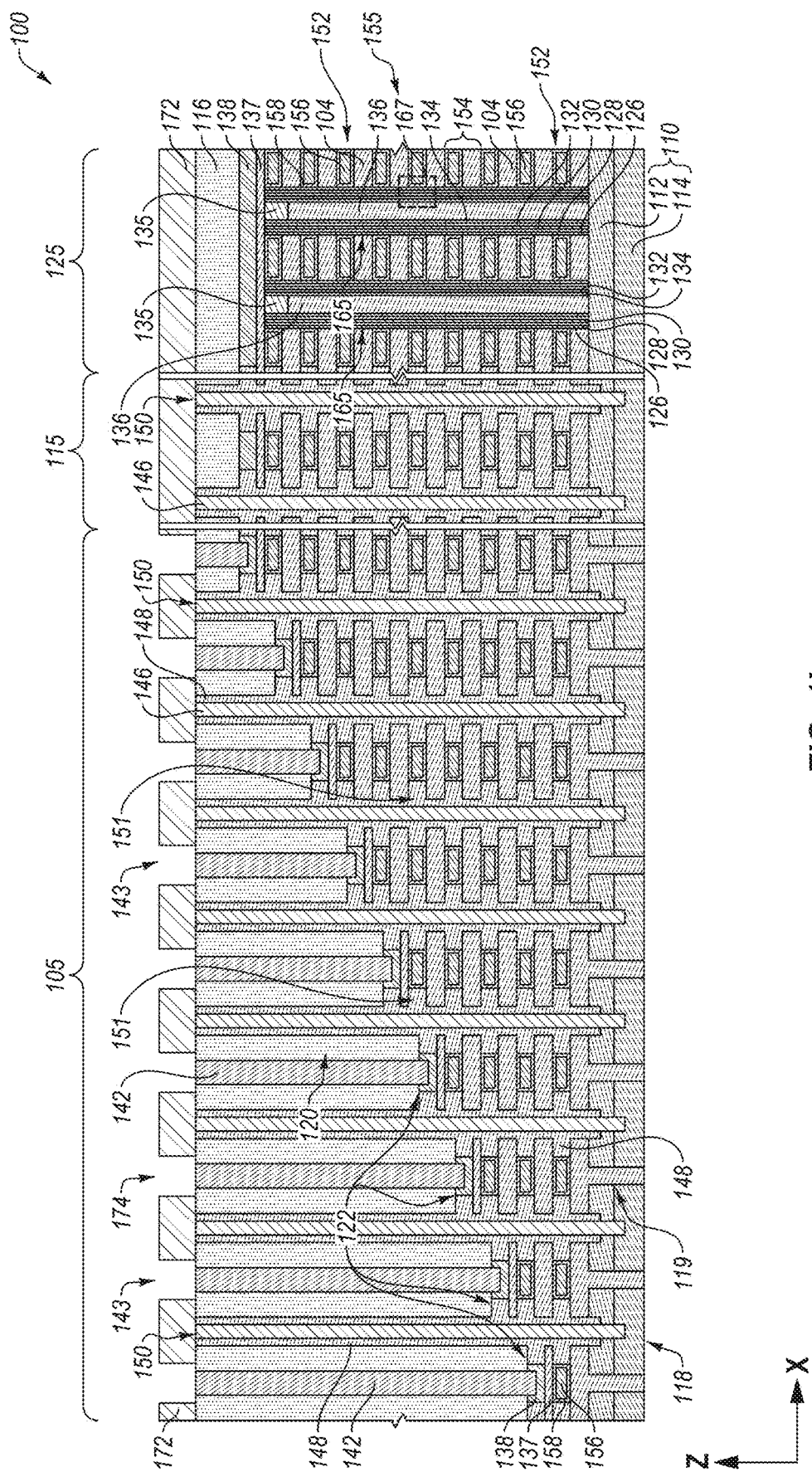

FIG. 1G is a simplified partial cross-sectional view of the microelectronic device structure 100 taken through section line H-H of FIG. 1H, which is a simplified partial top-down view of the microelectronic device structure 100. With combined reference to FIG. 1G and FIG. 1H, the additional insulative structures 106 (FIG. 1E) may be replaced with conductive structures 152 comprising a conductive material 156 to form a stack structure 155 comprising tiers 154 of the conductive structures 152 vertically interleaved with the insulative structures 104 through so-called "replacement gate" or "gate last" processing acts.

With reference to FIG. 1H, slots 160 (also referred to herein as "replacement gate slots") may be formed through the stack structure 102 (FIG. 1E) to facilitate the replacement of the additional insulative structures 106 (FIG. 1E) with the conductive structures 152 (FIG. 1G). The slots 160 may vertically (e.g., in the Z-direction) extend though the stack structure 102, such as through the dielectric material 116, the first insulative liner material 137, the second insulative liner material 138, and the tiers 108 (FIG. 1E) of the insulative structures 104 and the additional insulative structures 106 (FIG. 1E). In some embodiments, the slots 160 extend to the source tier 110, such as to the first source material 112.

In some embodiments, the slots 160 separate (e.g., divide) the microelectronic device structure 100 into block structures 162 (one of which is illustrated in FIG. 1H). In some embodiments, each block structure 162 includes three (3) rows of the pillar structures 150 located between laterally (e.g., in the Y-direction) neighboring slots 160. In some such embodiments, each column of the pillar structures 150 includes three (3) of the pillar structures 150. However, the disclosure is not so limited and, in other embodiments, each block structure 162 includes fewer (e.g., three, two, one) columns of the pillar structures 150; or each block structure 162 includes more (e.g., five, six, seven, eight) columns of the pillar structures 150.

The additional insulative structures 106 (FIG. 1E) may be selectively removed (e.g., exhumed) through the slots 160. Spaces between vertically neighboring (e.g., in the Z-direction) insulative structures 104 may be filled with the conductive material 156 to form the conductive structures 152 and the stack structure 155 including the tiers 154 of the insulative structures 104 and the conductive structures 152. In some embodiments, a conductive liner material 158 is formed within the spaces between the vertically neighboring insulative structures 104. In some such embodiments, the conductive structures 152 individually comprise the conductive liner material 158 in contact with the insulative structures 104 and the conductive material 156 in contact with the conductive liner material 158. The conductive liner material 158 may be vertically interposed between the conductive material 156 and an insulative structure 104. The conductive structures 152 may be located at locations corresponding to the locations of the additional insulative structures 106 removed through the slots 160.

Although FIG. 1H illustrates only two slots 160 and only one block structure 162, the disclosure is not so limited. The microelectronic device structure 100 may include a plurality of (e.g., four, five, six, eight) block structures 162, each separated from laterally neighboring (e.g., in the Y-direction) block structures 162 by a slot 160. In other words, the slots 160 may divide the microelectronic device structure 100 into any desired number of block structures 162.

The conductive material 156 of the conductive structures 152 may be formed of and include at least one conductive material, such as at least one metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively-doped semiconductor material (e.g., conductively-doped polysilicon, conductively-doped germanium (Ge), conductively-doped silicon germanium (SiGe)), at least one conductive metal-containing material (e.g., a conductive metal nitride, a conductive metal silicide, a conductive metal carbide, a conductive metal oxide), or combinations thereof. In some embodiments, the conductive material 156 is formed of and includes tungsten.

Each of the conductive structures 152 may individually include a substantially homogeneous distribution of conductive material 156, or a substantially heterogeneous distribution of the conductive material 156. In some embodiments, each of the conductive structures 152 of each of the tiers 154 of the stack structure 155 exhibits a substantially homogeneous distribution of the conductive material 156. In additional embodiments, at least one of the conductive structures 152 of at least one of the tiers 154 of the stack structure 155 exhibits a substantially heterogeneous distribution of the conductive material 156. The conductive structure 152 may, for example, be formed of and include a stack of at least two different conductive materials. The conductive structures 152 of each of the tiers 154 of the stack structure 155 may each be substantially planar and may each exhibit a desired thickness.

The conductive liner material 158 of the conductive structures 152 may be formed of and include, for example, at least one seed material from which the conductive material 156 may be formed. The conductive liner material 158 may be formed of and include, for example, one or more of at least one (e.g., titanium, tantalum), at least one metal nitride (e.g., tungsten nitride, titanium nitride, tantalum nitride), or at least one additional material. In some embodiments, the conductive liner material 158 comprises titanium nitride ($TiN_x$).

At least one vertically (e.g., in the Z-direction) lower conductive structure 152 of the stack structure 155 may be employed as at least one lower select gate (e.g., at least one source side select gate (SGS)) of the microelectronic device structure 100. In some embodiments, a single (e.g., only one) conductive structure 152 of a vertically lowermost tier 154 of the stack structure 155 is employed as a lower select gate (e.g., a SGS) of the microelectronic device structure 100. In addition, vertically (e.g., in the Z-direction) upper conductive structure(s) 152 of the stack structure 155 may be employed as upper select gate(s) (e.g., drain side select gate(s) (SGDs)) of the microelectronic device structure 100. In some embodiments, laterally-neighboring conductive structures 152 of a vertically uppermost tier 154 of the stack structure 155 (e.g., separated from each other by slots) are employed as upper select gates (e.g., SGDs) of the microelectronic device structure 100. In some embodiments, more than one (e.g., two, four, five, six) conductive structures 152 are employed as an upper select gate (e.g., a SGD) of the microelectronic device structure 100.

With continued reference to FIG. 1G, formation of the conductive structures 152 may form strings 165 of memory cells 167 (one of which is illustrated in broken box 167), each memory cell 167 located at an intersection of a conductive structure 152 and the memory cell materials (e.g., the charge blocking material 128, the memory material 130, the tunnel dielectric material 132) and the channel material 134. Each block structure 162 may include a plurality of the strings 165 of memory cells 167. The strings 165 of memory cells 167 may be located within the lateral boundaries of the array region 125.

Although the microelectronic device structure 100 has been described and illustrated as comprising memory cells 167 having a particular configuration, the disclosure is not so limited. In some embodiments, the memory cells 167 may comprise so-called "MONOS" (metal-oxide-nitride-oxide-semiconductor) memory cells. In additional embodiments, the memory cells 167 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In other embodiments, the memory cells 167 comprise so-called "floating gate" memory cells including floating gates (e.g., metallic floating gates) as charge storage structures. The floating gates may horizontally intervene between central structures of the strings 165 and the conductive structures 152.

Figure 1J:
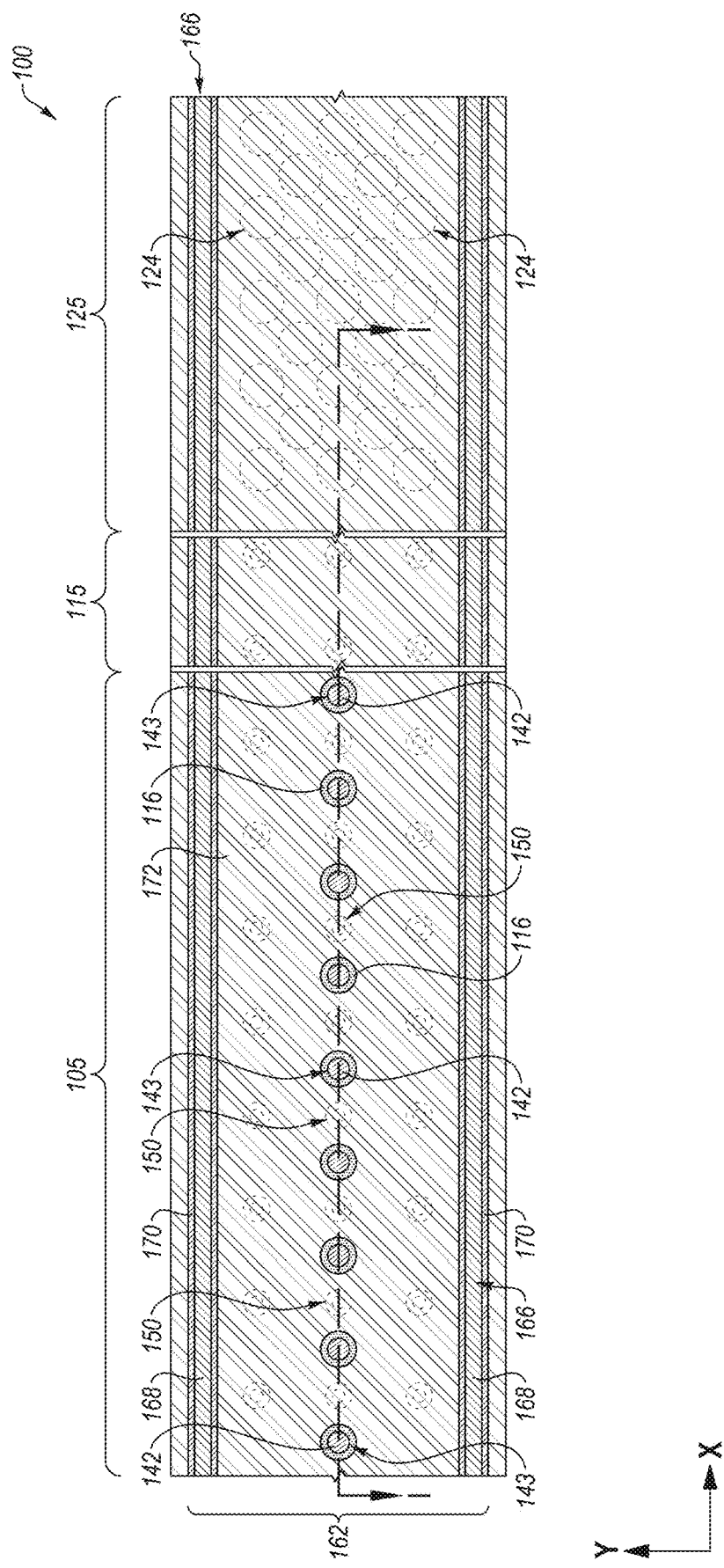

FIG. 1I is a simplified partial cross-sectional view of the microelectronic device structure 100 taken through section line I-I of FIG. 1J, which is a simplified partial top-down view of the microelectronic device structure 100. With reference to FIG. 1J, the slots 160 (FIG. 1H) may be filled with one or more materials to form the slot structures 166. In some embodiments, the slot structures 166 include conductive material 168 and liner material 170 horizontally neighboring the conductive material 168. The conductive material 168 may be in electrical communication with the source tier 110. In some embodiments, the conductive material 168 is formed of and includes polysilicon. The liner material 170 may electrically isolate the conductive material 168 from the conductive structures 152 (FIG. 1I) of the tiers 154 (FIG. 1I). The liner material 170 may comprise an insulative material, such as, for example, silicon dioxide.

With reference to FIG. 1I, after forming the slot structures 166, mask material 172 may be formed over the microelectronic device structure 100. Openings 174 may be formed within the mask material 172 to expose the sacrificial material 142 of the sacrificial structures 143.

Figure 1K:
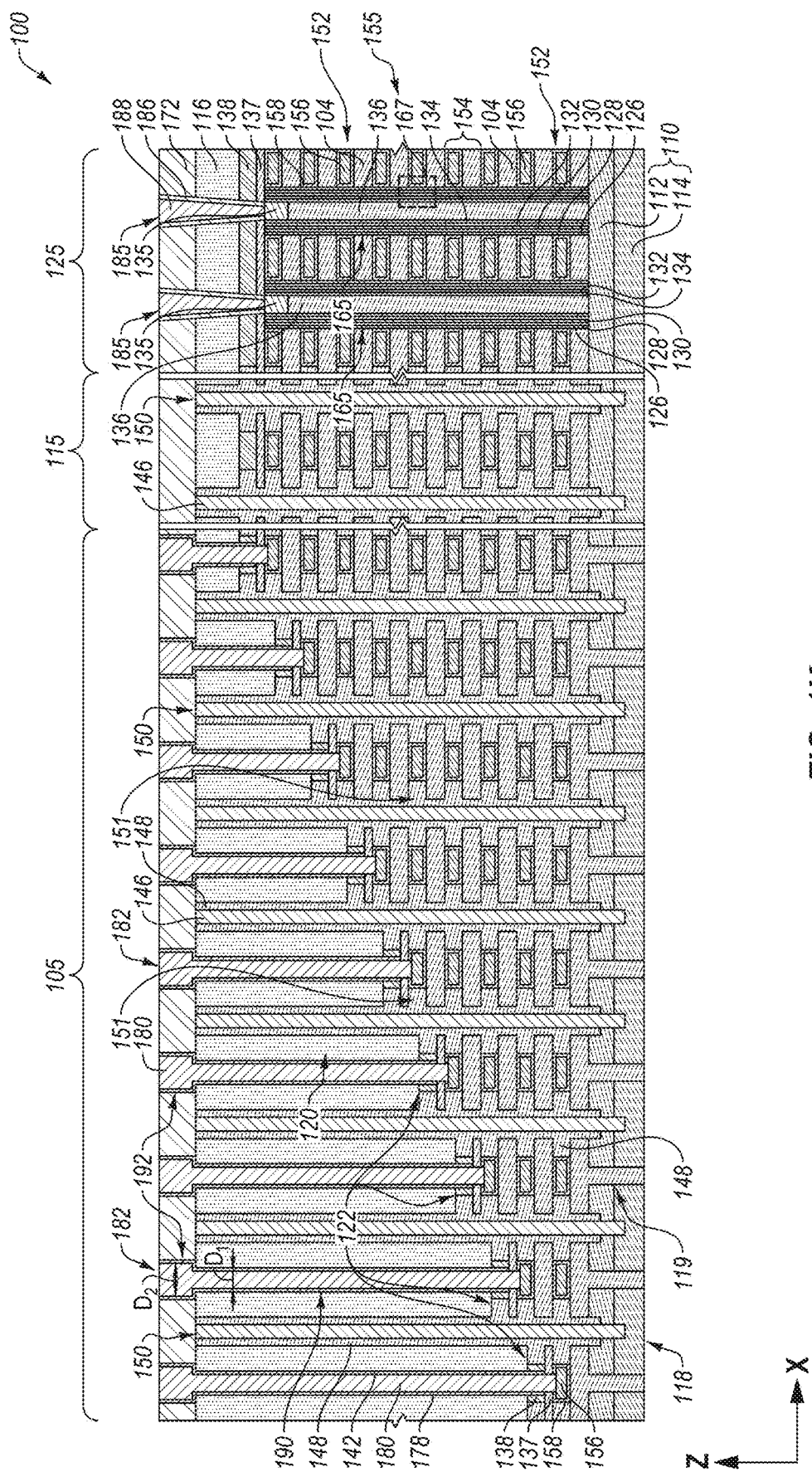

With reference to FIG. 1K, the sacrificial material 142 (FIG. 1I) of the sacrificial structures 143 (FIG. 1I) may be removed through the openings 174 (FIG. 1I) to form third openings corresponding to the size and location of the first openings 140 (FIG. 1B) and to expose the second insulative liner material 138 in the staircase region 105. In some embodiments, the second insulative liner material 138 comprises an etch stop material during removal of the sacrificial material 142. In other words, during removal of the sacrificial material 142 of the sacrificial structures 143, the second insulative liner material 138 may not be substantially removed. Removal of the sacrificial structures 143 may expose portions of the second insulative liner material 138.

After removal of the sacrificial structures 143, exposed portions of the second insulative liner material 138 in the staircase region 105 may be removed to expose underlying portions of the first insulative liner material 137. In some embodiments, the portions of the second insulative liner material 138 are selectively removed relative to the first insulative liner material 137, the dielectric material 116, and the mask material 172 with wet etchant, such as, for example, phosphoric acid. In other embodiments, the portions of the second insulative liner material 138 are selectively removed relative to the first insulative liner material 137, the dielectric material 116, and the mask material 172 with dry etchant, such as in a reactive ion etching (RIE) process. In some such embodiments, a so-called "punch through" etch may be performed to remove portions of the second insulative liner material 138 and expose the underlying portions of the first insulative liner material 137.

With continued reference to FIG. 1K, after the portions of the second insulative liner material 138 are removed, insulative liner material 178 may be formed within the openings. After forming the insulative liner material 178, laterally extending (e.g., in the X-direction, in the Y-direction) portions of the insulative liner material 178 may be removed. In some embodiments, underlying portions of the first insulative liner material 137 may be removed substantially concurrently with removal of the laterally extending portions of the insulative liner material 178 to expose the underlying conductive structure 152 (e.g., the conductive liner material 158 of the conductive structure 152) in the staircase region 105. In some embodiments, the exposed portions of the conductive liner material 158 may be removed to expose a portion of the conductive material 156 of the conductive structure 152. In some embodiments, the laterally extending portions of the first insulative liner material 137, the exposed portions of the first insulative liner material 137, and the conductive liner material 158 are removed by so-called punch through etch processes using reactive ion etching.

Although FIG. 1K has been described as removing exposed portions of the second insulative liner material 138 prior to forming the insulative liner material 178, the disclosure is not so limited. In other embodiments, the insulative liner material 178 may be formed within the openings prior to removal of the portions of the second insulative liner material 138. After forming the insulative liner material 178, the laterally extending portions of the insulative liner material, the second insulative liner material 138, the first insulative liner material 137, and the exposed portions of the conductive liner material 158 may be removed, such as by a reactive ion etching.

After removing the laterally extending portions of the insulative liner material 178, conductive material 180 may be formed over the insulative liner material 178 and fill remaining portions of the openings to form first conductive contact structures 182 in electrical communication with the conductive structures 152.

The insulative liner material 178 may comprise one or more of silicon dioxide and at least one metal oxide (e.g., one or more of aluminum oxide, hafnium oxide, zirconium oxide, lanthanum oxide, yttrium oxide, tantalum oxide, gadolinium oxide, niobium oxide, titanium oxide). In some embodiments, the insulative liner material 178 comprises aluminum oxide.

The conductive material 180 may include at least one conductive material, such as one or more of at least one metal (e.g., W, Ti, Mo, Nb, V, Hf, Ta, Cr, Zr, Fe, Ru, Os, Co, Rh, Ir, Ni, Pd, Pt, Cu, Ag, Au, Al), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), at least one conductive metal-containing material (e.g., a conductive metal nitride, a conductive metal silicide, a conductive metal carbide, a conductive metal oxide), and at least one conductively-doped semiconductor material (e.g., conductively-doped Si, conductively-doped Ge, conductively-doped SiGe). In some embodiments, the conductive material 180 comprises tungsten.

In some embodiments, the first conductive contact structures 182 may include a first portion 190 in electrical communication with a vertically (e.g., in the Z-direction) underlying conductive structure 152, such as with the conductive material 156 of the vertically underlying conductive structure 152. The first conductive contact structures 182 may further include a second portion 192 in electrical communication with the first portion 190. The size and location of the first portion 190 may correspond to the size and location of the first openings 140 (FIG. 1B), except that the first portion 190 vertically extends to the conductive material 156 of the conductive structure 152. The size and location of the second portion 192 may correspond to the size and location of the openings 174 (FIG. 1I) of the mask material 172 (FIG. 1I).

In some embodiments, a vertically (e.g., in the Z-direction) upper surface of the first portion 190 are substantially coplanar with a vertically upper surface of the pillar structures 150. In some embodiments, an upper surface of the second portion 192 is vertically above the upper surface of the pillar structures 150. In some embodiments, substantially all of the second portion 192 is vertically above the upper surface of the pillar structures 150.

With continued reference to FIG. 1K, the first portions 190 may have a lateral dimension $D_1$ (e.g., a diameter) that is smaller than a lateral dimension $D_2$ (e.g., a diameter) of the second portions 192. The lateral dimension $D_2$ of the second portions 192 may correspond to the size of the openings 174 (FIG. 1I). In some embodiments, the lateral dimension $D_2$ may be within a range from about 1.5 times greater than the lateral dimension $D_1$ of the first portion 190 to about 2.5 times the lateral dimension $D_1$ of the first portion 190. In some embodiments, the diameter $D_2$ is at least about 2.0 times the diameter $D_1$. In some embodiments, $D_2$ may be about the same size as $D_1$. In other embodiments, $D_2$ is such that the lateral boundary of the insulative liner material 178 at the second portion 192 of the first conductive contact structures 182 do not laterally extend beyond the liner material 148 to reduce or prevent electrical shorting of the first conductive contact structure 182 to the first material 146 of the pillar structure 150. Stated another way, $D_2$ may be sized such that the insulative liner material 178 does not laterally extend beyond the lateral boundary of the liner material 148.

In some embodiments, the lateral dimension $D_1$ is within a range from about 60 nm to about 120 nm, such as from about 60 nm to about 80 nm, from about 80 nm to about 100 nm, or from about 100 nm to about 120 nm. In some embodiments, the lateral dimension $D_1$ is within a range from about 80 nm to about 100 nm.

The lateral dimension $D_2$ may be within a range from about 90 nm to about 600 nm, such as from about 90 nm to about 120 nm, from about 120 nm to about 150 nm, from about 150 nm to about 200 nm, from about 200 nm to about 300 nm, from about 300 nm to about 400 nm, from about 400 nm to about 500 nm, or from about 500 nm to about 600 nm.

With continued reference to FIG. 1K, second conductive contact structures 185 may be formed in electrical communication with the strings 165 of memory cells 167 in the array region 125. In some embodiments, the second conductive contact structures 185 individually comprise a liner material 186 in contact with the mask material 172, the dielectric material 116, the second insulative liner material 138, and the first insulative liner material 137; and a conductive material 188 in contact with the liner material 186 and the conductive material 135.

The liner material 186 may be formed of and include insulative material, such as one or more of the materials described above with reference to the insulative liner material 178. In some embodiments, the liner material 186 comprises substantially the same material composition as the insulative liner material 178. In some embodiments, the liner material 186 comprises silicon dioxide.

The conductive material 188 may be formed of and include conductive material, such as one or more of the materials described above with reference to the conductive material 180. In some embodiments, the conductive material 188 comprises substantially the same material composition as the conductive material 180. In some embodiments, the conductive material 188 comprises tungsten.

In some embodiments, the second conductive contact structures 185 are in electrical communication with, for example, a conductive line (e.g., a bit line) for providing access to the strings 165 of memory cells 167.

The second conductive contact structures 185 may be formed by forming openings through the mask material 172, the dielectric material 116, the second insulative liner material 138, and the first insulative liner material 137 to expose the underlying strings 165 of memory cells 167. For example, in some embodiments, at least a portion of the conductive material 135 may be exposed through the openings. The second conductive contact structures 185 may be in electrical communication with the conductive material.

With continued reference to FIG. 1K, in some embodiments, portions of the second insulative liner material 138 are maintained (e.g., remain) vertically over each step 122 of the stair step structure 120. The second insulative liner material 138 may laterally (e.g., in the X-direction, in the Y-direction) surround a vertically (e.g., in the Z-direction) lower portion of the first portion 190 of the first conductive contact structures 182. In some embodiments, the second insulative liner material 138 is vertically interposed between the dielectric material 116 and the vertically uppermost conductive structure 152 laterally (e.g., in the X-direction, in the Y-direction) aligned step 122. In other words, the second insulative liner material 138 may laterally surround at least a lower portion of the first portion 190 of the first conductive contact structure 182 proximate the step 122 with which the first conductive contact structure 182 is in contact.

Forming the first conductive contact structures 182 by forming the first openings 140 (FIG. 1B) prior to forming the pillar structures 150 (FIG. 1E) may facilitate forming the microelectronic device structure 100 to include a greater density of strings 165 of memory cells 167 compared to conventional microelectronic devices. By way of non-limiting example, forming the first openings 140 from which the conductive contact structures 182 are formed prior to forming the pillar structures 150 may facilitate forming the block structures 162 (FIG. 1J) to include the conductive contact structures 182 directly laterally (e.g., in the X-direction) some of the pillar structures 150 and may improve alignment of the conductive contact structures 182 and the pillar structures 150. Accordingly, a greater number of strings 165 of memory cells 167 may be placed within a given area of the microelectronic device structure 100 compared to conventional microelectronic devices.

Figure 2:
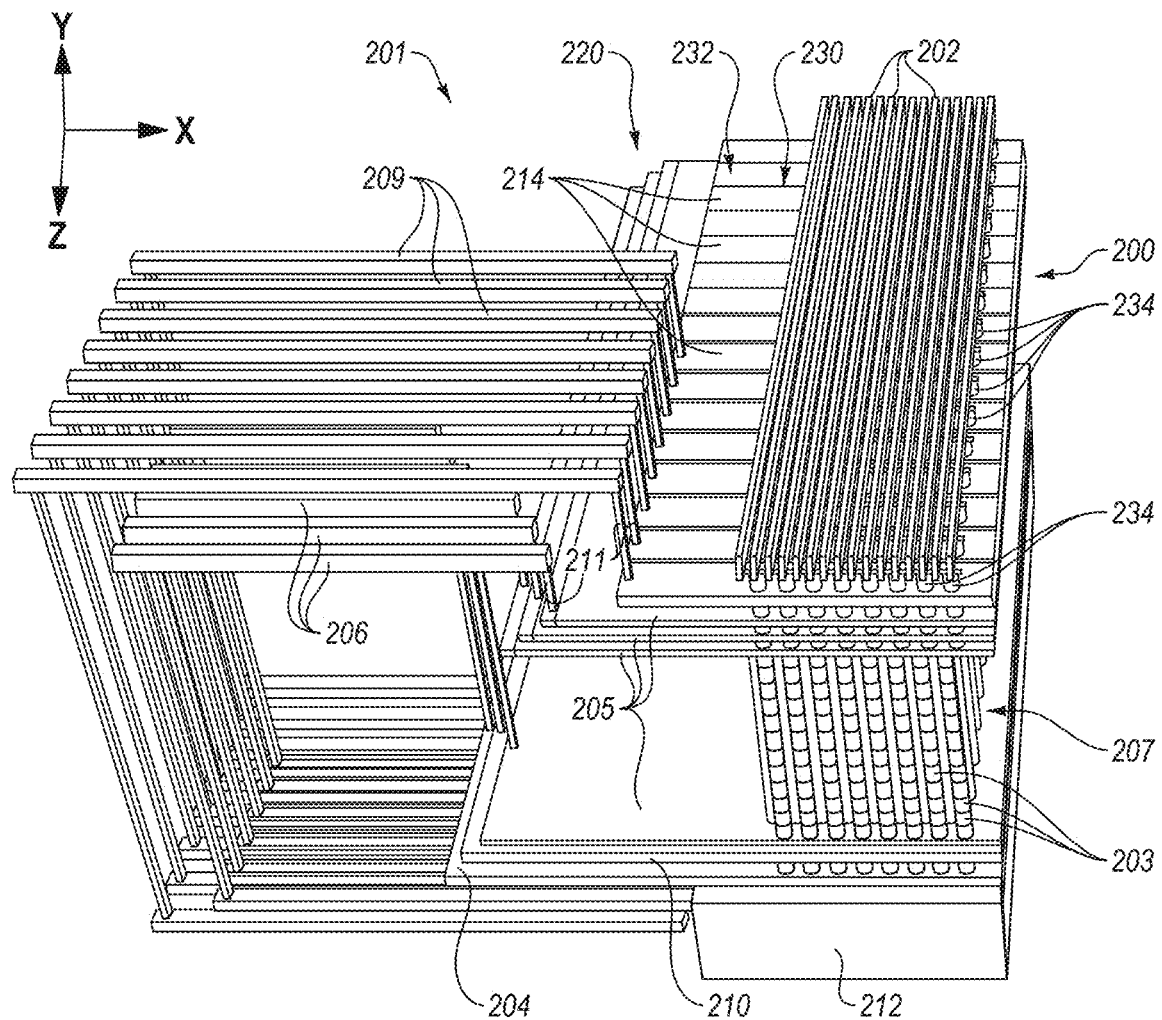
FIG. 2 is a partial cutaway perspective view of a microelectronic device, in accordance with embodiments of the disclosure.

FIG. 2 illustrates a partial cutaway perspective view of a portion of a microelectronic device 201 (e.g., a memory device, such as a dual deck 3D NAND Flash memory device) including a microelectronic device structure 200. The microelectronic device structure 200 may be substantially similar to the microelectronic device structure 100 following the processing stage previously described with reference to FIG. 1K. As shown in FIG. 2, the microelectronic device structure 200 may include a stair step structure 220 (e.g., including the stair step structure 120 (FIG. 1K)) defining contact regions for connecting access lines 206 to conductive tiers 205 (e.g., conductive layers, conductive plates, such as the conductive structures 152 (FIG. 1K)). The microelectronic device structure 200 may include vertical strings 207 (e.g., strings 165 (FIG. 1K)) of memory cells 203 (e.g., memory cells 167 (FIG. 1K)) that are coupled to each other in series. The vertical strings 207 may extend vertically (e.g., in the Z-direction) and orthogonally to conductive lines and tiers 205, such as data lines 202, a source tier 204 (e.g., the source tier 110 (FIG. 1K)), the conductive tiers 205, the access lines 206, first select gates 214 (e.g., upper select gates, drain select gates (SGDs)), select lines 209, and a second select gate 210 (e.g., a lower select gate, a source select gate (SGS)). The first select gates 214 may be horizontally divided (e.g., in the Y-direction) into multiple blocks 232 (e.g., block structures 162 (FIG. 1J)) horizontally separated (e.g., in the Y-direction) from one another by slot structures 230 (e.g., slot structures 166 (FIG. 1J)).

Vertical conductive contacts 211 (e.g., the first conductive contact structures 182 (FIG. 1K)) may electrically couple components to each other as shown. For example, the select lines 209 may be electrically coupled to the first select gates 214 and the access lines 206 may be electrically coupled to the conductive tiers 205. The microelectronic device 201 may also include a control unit 212 positioned under the memory array, which may include control logic devices configured to control various operations of other features (e.g., the vertical strings 207 of memory cells 203) of the microelectronic device 201. By way of non-limiting example, the control unit 212 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 212 may be electrically coupled to the data lines 202, the source tier 204, the access lines 206, the first select gates 214, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 214 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., bit lines) may extend horizontally in a second direction (e.g., in the Y-direction) that is at an angle (e.g., perpendicular) to the first direction in which the first select gates 214 extend. The data lines 202 may be coupled to respective second groups of the vertical strings 207 at the first end (e.g., the upper end) of the vertical strings 207. A first group of vertical strings 207 coupled to a respective first select gate 214 may share a particular vertical string 207 with a second group of vertical strings 207 coupled to a respective data line 202. Thus, a particular vertical string 207 may be selected at an intersection of a particular first select gate 214 and a particular data line 202. Accordingly, the first select gates 214 may be used for selecting memory cells 203 of the vertical strings 207 of memory cells 203.

The conductive tiers 205 (e.g., word line plates, such as the conductive structures 152 (FIG. 1K)) may extend in respective horizontal planes. The conductive tiers 205 may be stacked vertically, such that each conductive tier 205 is coupled to all of the vertical strings 207 of memory cells 203, and the vertical strings 207 of the memory cells 203 extend vertically through the stack of conductive tiers 205. The conductive tiers 205 may be coupled to or may form control gates of the memory cells 203 to which the conductive tiers 205 are coupled. Each conductive tier 205 may be coupled to one memory cell 203 of a particular vertical string 207 of memory cells 203.

The first select gates 214 and the second select gates 210 may operate to select a particular vertical string 207 of the memory cells 203 between a particular data line 202 and the source tier 204. Thus, a particular memory cell 203 may be selected and electrically coupled to a data line 202 by operation of (e.g., by selecting) the appropriate first select gate 214, second select gate 210, and conductive tier 205 that are coupled to the particular memory cell 203.

The stair step structure 220 may be configured to provide electrical connection between the access lines 206 and the conductive tiers 205 through the vertical conductive contacts 211. In other words, a particular level of the conductive tiers 205 may be selected via an access line 206 in electrical communication with a respective vertical conductive contact 211 in electrical communication with the particular tier 205.

The data lines 202 may be electrically coupled to the vertical strings 207 through conductive contact structures 234 (e.g., the second conductive contact structures 185 (FIG. 1K)).

Thus, in accordance with embodiments of the disclosure a microelectronic device comprises a stack structure comprising a vertically alternating sequence of conductive structures and insulative structures arranged in tiers, a stair step structure within the stack structure and having steps comprising lateral edges of the tiers, pillar structures extending through the stack structure and the stair step structure and in contact with a source tier vertically underlying the stack structure, and conductive contact structures in contact with the steps of the stair step structure, the conductive contact structures individually comprising a first portion and a second portion vertically overlying the first portion, the second portion vertically above the pillar structures and having a greater lateral dimension than the first portion.

Thus, in accordance with additional embodiments of the disclosure, a microelectronic device comprises a stack structure comprising alternating conductive structures and insulative structures arranged in tiers, a stair step structure within the stack structure and having steps comprising lateral ends of the tiers, a dielectric material vertically overlying the stair step structure, conductive contact structures vertically extending through the dielectric material, each conductive contact structure individually in electrical communication with one of the steps of the stair step structure, an oxide liner material laterally between the dielectric material and the conductive contact structures, and a nitride material laterally neighboring a lower portion of each conductive contact structure, the nitride material vertically between the dielectric material and the steps.

Furthermore, in accordance with further embodiments of the disclosure, a memory device comprises a stack structure comprising conductive structures vertically interleaved with insulative structures arranged in tiers, strings of memory cells vertically extending through the stack structure, a stair step structure within the stack structure defined by steps comprising lateral ends of the tiers, an insulative material vertically overlying the stair step structure, conductive contact structures vertically extending through the insulative material. Each of the conductive contact structures individually comprises a first portion in contact with the one of the steps of the stair step structure, and a second portion vertically overlying and in electrical communication with the first portion, the second portion having a greater lateral dimension than the first portion.

Moreover, in accordance with yet additional embodiments of the disclosure, a method of forming a microelectronic device comprises forming first insulative liner material over a stair step structure, forming second insulative liner material over the first insulative liner material, forming first openings through insulative material vertically overlying the stair step structure and exposing portions of the second insulative liner material through the first openings, filling the first openings with sacrificial material to form sacrificial structures, forming second openings through the insulative material and the stair step structure and laterally neighboring the sacrificial structures, filling the second openings with conductive material to form pillar structures, removing the sacrificial material of the sacrificial structures to form third openings and to expose the second insulative liner material, removing portions of the second insulative liner material and the first insulative liner material through the third openings to expose the steps vertically underlying the third openings, and forming additional conductive material in the third openings and in electrical communication with the steps of stair step structure.

In addition, in accordance with further embodiments of the disclosure, a method of forming a microelectronic device comprises forming sacrificial structures over steps of a stair step structure defined in a stack structure comprising tiers of vertically interleaved insulative structures and additional insulative structures, forming pillar structures vertically extending through dielectric material overlying the stair step structure and the stack structure, the pillar structures laterally neighboring some of the sacrificial structures, exposing the sacrificial structures through mask material overlying the sacrificial structures and the pillar structures, removing the sacrificial structures through the mask material to form openings, and forming conductive material in the openings.

Figure 3:
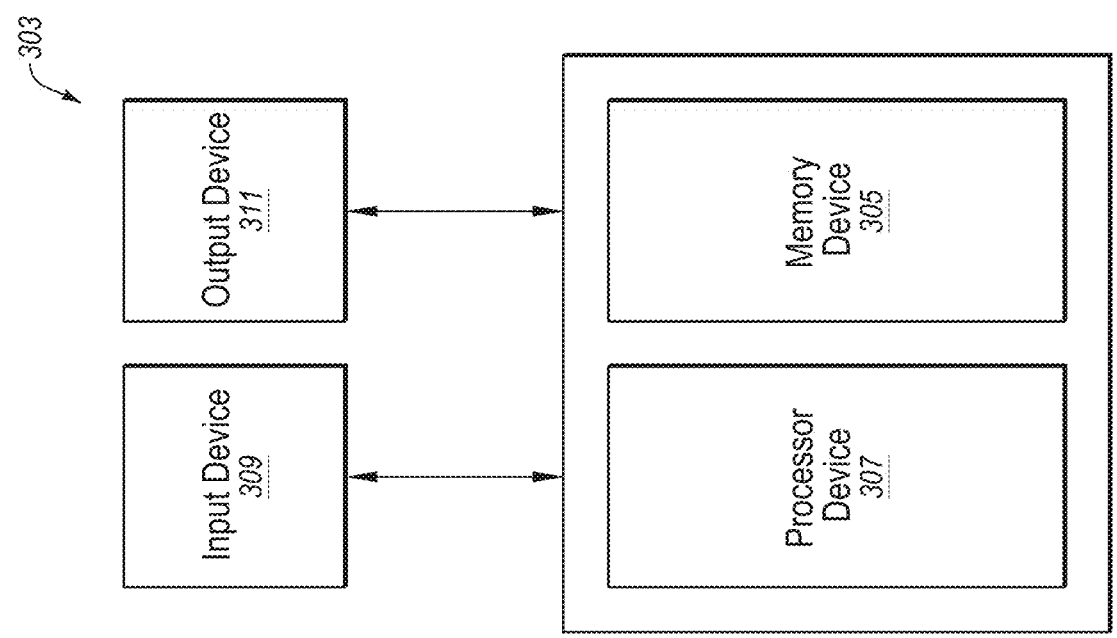
FIG. 3 is a block diagram of an electronic system, in accordance with embodiments of the disclosure.

Microelectronic devices (e.g., the microelectronic device 201 including microelectronic device structures (e.g., the microelectronic device structures 100, 200) of the disclosure may be included in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of a microelectronic device structure previously described herein (e.g., the microelectronic device structure 100, 200 previously described with reference to FIG. 1A through FIG. 1K and FIG. 2) or a microelectronic device (e.g., the microelectronic device 201) previously described with reference to FIG. 2).

The electronic system 303 may further include at least one electronic signal processor device 307 (often referred to as a "microprocessor"). The electronic signal processor device 307 may, optionally, include an embodiment of one or more of a microelectronic device and a microelectronic device structure previously described herein. The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
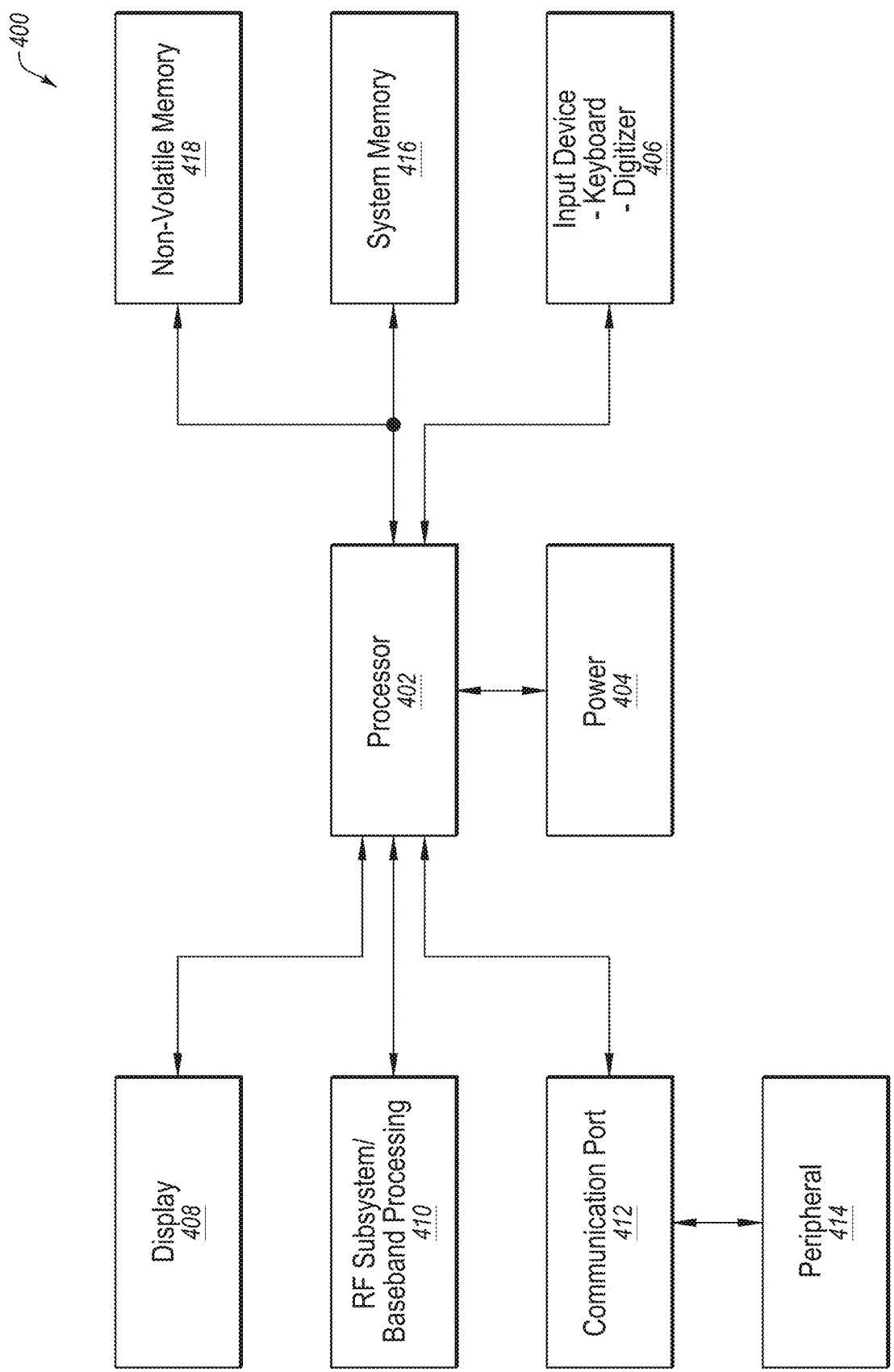
FIG. 4 is a block diagram of a processor-based system, in accordance with embodiments of the disclosure.

With reference to FIG. 4, depicted is a processor-based system 400. The processor-based system 400 may include one or more of a microelectronic device and a microelectronic device structure previously described herein and manufactured in accordance with embodiments of the disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include one or more of a microelectronic device and a microelectronic device structure previously described herein and manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random-access memory (STT-MRAM), magnetic random-access memory (MRAM), dynamic random-access memory (DRAM), static random-access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as one or more of a microelectronic device and a microelectronic device structure previously described herein.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include microelectronic devices, such as one or more of a microelectronic device and a microelectronic device structure previously described herein.

Thus, in accordance with embodiments of the disclosure an electronic system comprises an input device, an output device, a processor device operably coupled to the input device and the output device, and a memory device operably coupled to the processor device and comprising at least one microelectronic device structure. The at least one microelectronic device structure comprises a stair step structure within a stack structure and comprising a vertically alternating sequence of conductive structures and insulative structures arranged in tiers, pillar structures vertically extending through the stack structure to a source structure vertically underlying the stack structure, and conductive contact structures in electrical communication with conductive structures of the stair step structure, the conductive contact structures vertically extending above the pillar structures.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
   a stack structure comprising a vertically alternating sequence of conductive structures and insulative structures arranged in tiers;
   a stair step structure within the stack structure and having steps comprising lateral edges of the tiers;
   pillar structures extending through the stack structure and the stair step structure and in contact with a source tier vertically underlying the stack structure, at least one of the pillar structures comprising conductive material; and
   conductive contact structures in contact with the steps of the stair step structure, the conductive contact structures individually comprising:
   a first portion having an upper surface substantially coplanar with additional upper surfaces of the pillar structures; and
   a second portion vertically overlying the first portion, the second portion vertically above the pillar structures and having a greater lateral dimension than the first portion.

2. The microelectronic device of claim 1, further comprising an insulative liner material laterally between each individual conductive contact structure and a dielectric material vertically overlying the stair step structure.

3. The microelectronic device of claim 2, wherein the insulative liner material comprises a different material composition than the dielectric material.

4. The microelectronic device of claim 1, wherein the lateral dimension of the second portion is at least 1.5 times greater than the lateral dimension of the first portion.

5. The microelectronic device of claim 1, further comprising a nitride liner material vertically overlying the stair step structure, the conductive contact structures vertically extending through the nitride liner material.

6. The microelectronic device of claim 1, further comprising strings of memory cells vertically extending through the stack structure.

7. A microelectronic device, comprising:
a stack structure comprising alternating conductive structures and insulative structures arranged in tiers;
a stair step structure within the stack structure and having steps comprising lateral ends of the tiers;
a dielectric material vertically overlying the stair step structure;
conductive contact structures vertically extending through the dielectric material, each conductive contact structure individually in electrical communication with one of the steps of the stair step structure;
an oxide liner material laterally between the dielectric material and the conductive contact structures; and
a nitride material laterally neighboring a lower portion of each conductive contact structure, the nitride material vertically between the dielectric material and the steps.

8. The microelectronic device of claim 7, further comprising pillar structures vertically extending through the dielectric material and the stack structure.

9. The microelectronic device of claim 8, wherein the pillar structures comprise conductive material.

10. The microelectronic device of claim 8, wherein the conductive contact structures vertically extend above the pillar structures.

11. The microelectronic device of claim 7, wherein the conductive contact structures each individually comprise a first portion in contact with the one of the steps of the stair step structure and a second portion in contact with the first portion.

12. The microelectronic device of claim 11, wherein the second portion has a larger diameter than the first portion.

13. The microelectronic device of claim 7, wherein the conductive structures each individually comprises conductive liner material in contact with vertically neighboring insulative structures and conductive material in contact with the conductive liner material.

14. The microelectronic device of claim 13, wherein the conductive contact structures are in contact with the conductive material of the conductive structures.

15. A memory device, comprising:
a stack structure comprising conductive structures vertically interleaved with insulative structures arranged in tiers;
strings of memory cells vertically extending through the stack structure;
a stair step structure within the stack structure defined by steps comprising lateral ends of the tiers;
an insulative material vertically overlying the stair step structure;
conductive contact structures vertically extending through the insulative material, each of the conductive contact structures individually comprising:
a first portion in contact with the one of the steps of the stair step structure; and
a second portion vertically overlying and in electrical communication with the first portion, the second portion having a greater lateral dimension than the first portion; and
pillar structures vertically extending through the stack structure and the stair step structure and laterally neighboring the conductive contact structures, at least one of the pillar structures comprising conductive material.

16. The memory device of claim 15, wherein the second portion has a diameter of at least about two times greater than a diameter of the first portion.

17. The memory device of claim 15, wherein a vertical height of the second portion is less than a vertical height of the first portion.

18. The memory device of claim 15, further comprising a nitride material vertically overlying the stair step structure and laterally surrounding at least a portion of the first portion of each of the conductive contact structures.

19. The memory device of claim 15, wherein the second portion of each of the conductive contact structures vertically extend above an upper portion of each of the pillar structures.

20. The memory device of claim 15, wherein an interface between the first portion and the second portion is substantially coplanar with an upper surface of the pillar structures.

21. A method of forming a microelectronic device, the method comprising:
forming first insulative liner material over a stair step structure;
forming second insulative liner material over the first insulative liner material;
forming first openings through insulative material vertically overlying the stair step structure and exposing portions of the second insulative liner material through the first openings;
filling the first openings with sacrificial material to form sacrificial structures;
forming second openings through the insulative material and the stair step structure and laterally neighboring the sacrificial structures;
filling one or more of the second openings with conductive material to form pillar structures vertically extending through the insulative material and the stair step structure and laterally neighboring the sacrificial structures, one or more of the pillar structures comprising the conductive material;
removing the sacrificial material of the sacrificial structures to form third openings and to expose the second insulative liner material;
removing portions of the second insulative liner material and the first insulative liner material through the third openings to expose steps vertically underlying the third openings; and
filling the third openings with additional conductive material to form conductive contact structures individually comprising:
a first portion in electrical communication with the steps of the stair step structure; and
a second portion in electrical communication with the first portion and having a greater lateral dimension than the first portion.

22. The method of claim 21, wherein forming first openings through an insulative material vertically overlying the stair step structure and exposing portions of the second insulative liner material comprises exposing portions of a second insulative liner material comprising silicon nitride.

23. The method of claim 21, wherein filling the first openings with sacrificial material to form sacrificial structures comprises forming sacrificial structures comprising one of polysilicon and tungsten.

24. The method of claim 21, further comprising:
forming a mask material over the sacrificial structures and the pillar structures after filling the second openings; and
exposing the sacrificial structures through the mask material.

25. The method of claim 21, wherein filling the third openings with the additional conductive material comprises forming the conductive contact structures having a greater vertical height than the pillar structures.

26. A method of forming a microelectronic device, the method comprising:
forming sacrificial structures over steps of a stair step structure defined in a stack structure comprising tiers of vertically interleaved insulative structures and additional insulative structures;
forming pillar structures vertically extending through the stair step structure and the stack structure, the pillar structures laterally neighboring some of the sacrificial structures, at least one of the pillar structures comprising conductive material;
exposing the sacrificial structures through mask material overlying the sacrificial structures and the pillar structures;
removing the sacrificial structures through the mask material to form openings; and
filling the openings with additional conductive material to form conductive contact structures individually comprising:
a first portion in electrical communication with the conductive material; and
a second portion vertically overlying the first portion and having a greater lateral dimension than a lateral dimension of the first portion.

27. The method of claim 26, wherein forming sacrificial structures comprises forming the sacrificial structures to comprise one of tungsten and polysilicon.

28. The method of claim 26, further comprising:
forming slots vertically extending through the stack structure;
removing the additional insulative structures through the slots; and
forming conductive structures between vertically neighboring insulative structures.

29. The method of claim 28, wherein filling the openings with the additional conductive material comprises forming the conductive contact structures in electrical communication with the conductive structures.

30. The method of claim 26, wherein forming sacrificial structures over steps of a stair step structure comprises forming the sacrificial structures in contact with a nitride liner material over the steps of the stair step structure.

31. An electronic system, comprising:
an input device;
an output device;
a processor device operably coupled to the input device and the output device; and
a memory device operably coupled to the processor device and comprising at least one microelectronic device structure, the at least one microelectronic device structure comprising:
a stair step structure within a stack structure and comprising a vertically alternating sequence of conductive structures and insulative structures arranged in tiers;
pillar structures vertically extending through the stair step structure and the stack structure to a source structure vertically underlying the stack structure, at least one of the pillar structures comprising conductive material; and
conductive contact structures in electrical communication with conductive structures of the stair step structure, the conductive contact structures vertically extending above the pillar structures and individually comprising:
a first portion in electrical communication with a respective one of the steps of the stair step structure; and
a second portion in electrical communication with the first portion and having a greater lateral dimension than the first portion.

* * * * *